(12) United States Patent
Hwang et al.

(10) Patent No.: US 10,461,030 B2
(45) Date of Patent: Oct. 29, 2019

(54) PAD STRUCTURES AND WIRING STRUCTURES IN A VERTICAL TYPE SEMICONDUCTOR DEVICE

(71) Applicant: Samsung Electronics Co., Ltd., Suwon-si, Gyeonggi-do (KR)

(72) Inventors: Sung-Min Hwang, Seoul (KR); Young-Ho Lee, Hwaseong-si (KR); Seong-Soon Cho, Suwon-si (KR); Woon-Kyung Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/331,224

(22) Filed: Oct. 21, 2016

(65) Prior Publication Data

US 2017/0040254 A1 Feb. 9, 2017

Related U.S. Application Data

(63) Continuation of application No. 14/156,827, filed on Jan. 16, 2014, now abandoned.

(30) Foreign Application Priority Data

Jan. 17, 2013 (KR) .......... 10-2013-0005317

(51) Int. Cl.
*H01L 23/48* (2006.01)
*H01L 23/52* (2006.01)
(Continued)

(52) U.S. Cl.
CPC ........ *H01L 23/528* (2013.01); *H01L 27/1157* (2013.01); *H01L 27/11524* (2013.01);
(Continued)

(58) Field of Classification Search
CPC ......... H01L 27/11524; H01L 27/11548; H01L 27/11556; H01L 27/1157; H01L 27/11575;
(Continued)

(56) References Cited

U.S. PATENT DOCUMENTS 7,847,334 B2 12/2010 Katsumata et al.
7,851,849 B2 12/2010 Kiyotoshi
(Continued)

FOREIGN PATENT DOCUMENTS

JP 2007-266143 A 10/2007
JP 2008-258458 A 10/2008
(Continued)

OTHER PUBLICATIONS

Japanese Office Action dated Dec. 19, 2017 issued in corresponding Japanese Application No. 2014-004390. (no English translation).
(Continued)

*Primary Examiner* — Duy T Nguyen
*Assistant Examiner* — Dilinh P Nguyen
(74) *Attorney, Agent, or Firm* — Harness, Dickey & Pierce, P.L.C.

(57) ABSTRACT

Step shape pad structure and wiring structure in vertical type semiconductor device are include a first conductive line having a first line shape and including first pad regions at an upper surface of an edge portion, and a second conductive line having s second line shape and being spaced apart from the first conductive line and provided on the first conductive line. An end portion of the first conductive line is extended to a first position. Second pad regions are included on an upper surface of an edge portion of the second conductive line. An end portion of the second conductive line is extended to the first position. The second conductive line includes a dent portion at a facing portion to the first pad
(Continued)

regions in a vertical direction to expose the first pad regions. The pad structure may be used in a vertical type nonvolatile memory device.

13 Claims, 32 Drawing Sheets

(51) Int. Cl.
    *H01L 23/528*     (2006.01)
    *H01L 27/11524*     (2017.01)
    *H01L 27/11556*     (2017.01)
    *H01L 27/1157*     (2017.01)
    *H01L 27/11548*     (2017.01)
    *H01L 27/11575*     (2017.01)
    *H01L 27/11582*     (2017.01)

(52) U.S. Cl.
    CPC .. *H01L 27/11548* (2013.01); *H01L 27/11556* (2013.01); *H01L 27/11575* (2013.01); *H01L 27/11582* (2013.01); *H01L 2924/0002* (2013.01)

(58) Field of Classification Search
    CPC ............ H01L 27/11582; H01L 23/522; H01L 23/5226; H01L 23/49838; H01L 2224/1302; H01L 2224/141; H01L 2224/161; H01L 2224/171; H01L 2224/211; H01L 2224/2902; H01L 2224/301; H01L 2224/321; H01L 2224/331
    USPC .................. 257/774, 758, 786, 324; 438/261
    See application file for complete search history.

(56) References Cited

U.S. PATENT DOCUMENTS

| | | | |
|---|---|---|---|
| 7,855,457 B2 | 12/2010 | Mizukami et al. | |
| 7,884,417 B2 | 2/2011 | Mizukami et al. | |
| 7,910,432 B2 | 3/2011 | Tanaka et al. | |
| 7,982,261 B2 | 7/2011 | Kidoh et al. | |
| 8,154,128 B2 | 4/2012 | Lung | |
| 8,247,863 B2 | 8/2012 | Fukuzumi et al. | |
| 8,456,909 B2 | 6/2013 | Lee et al. | |
| 8,492,824 B2 | 7/2013 | Yahashi | |
| 9,041,093 B2 | 5/2015 | Tanaka et al. | |
| 2009/0310415 A1 | 12/2009 | Jin et al. | |
| 2010/0020608 A1 | 1/2010 | Kamigaichi et al. | |
| 2010/0052042 A1* | 3/2010 | Tanaka ................ | H01L 21/8221 257/324 |
| 2010/0155826 A1 | 6/2010 | Wenxu et al. | |
| 2010/0207186 A1 | 8/2010 | Higashi et al. | |
| 2010/0323505 A1 | 12/2010 | Ishikawa et al. | |
| 2011/0092038 A1* | 4/2011 | Choi ................ | H01L 27/11526 438/268 |
| 2011/0169071 A1 | 7/2011 | Uenaka et al. | |
| 2011/0201167 A1 | 8/2011 | Satonaka et al. | |
| 2011/0204420 A1 | 8/2011 | Kim et al. | |
| 2011/0244666 A1 | 10/2011 | Kim et al. | |
| 2011/0266604 A1 | 11/2011 | Kim et al. | |
| 2011/0284946 A1 | 11/2011 | Kiyotoshi | |
| 2011/0316072 A1 | 12/2011 | Lee | |
| 2012/0211816 A1 | 8/2012 | Yahashi | |
| 2013/0009274 A1* | 1/2013 | Lee ................... | H01L 27/11582 257/499 |
| 2017/0338244 A1 | 11/2017 | Kito et al. | |

FOREIGN PATENT DOCUMENTS

| | | |
|---|---|---|
| JP | 2009-170661 A | 7/2009 |
| JP | 2010-199314 A | 9/2010 |
| JP | 2011-222994 A | 11/2011 |
| JP | 2012-174892 A | 9/2012 |
| JP | 2012-186302 A | 9/2012 |
| KR | 2011-0119896 A | 11/2011 |
| KR | 2011-0121332 A | 11/2011 |
| KR | 101113766 B1 | 2/2012 |

OTHER PUBLICATIONS

Office Action for corresponding Japanese Application No. 2014-004390 dated Aug. 7, 2018.

* cited by examiner

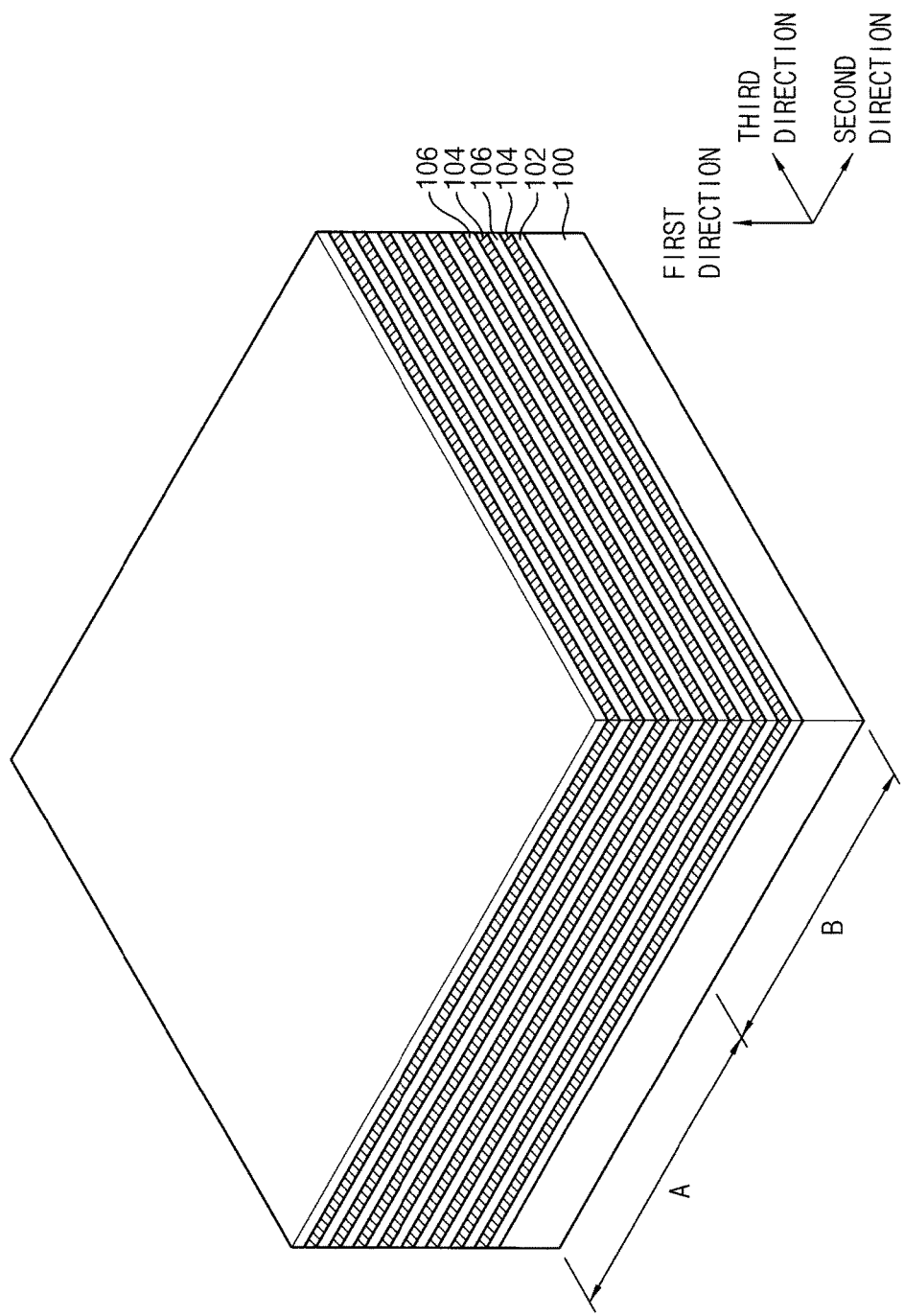

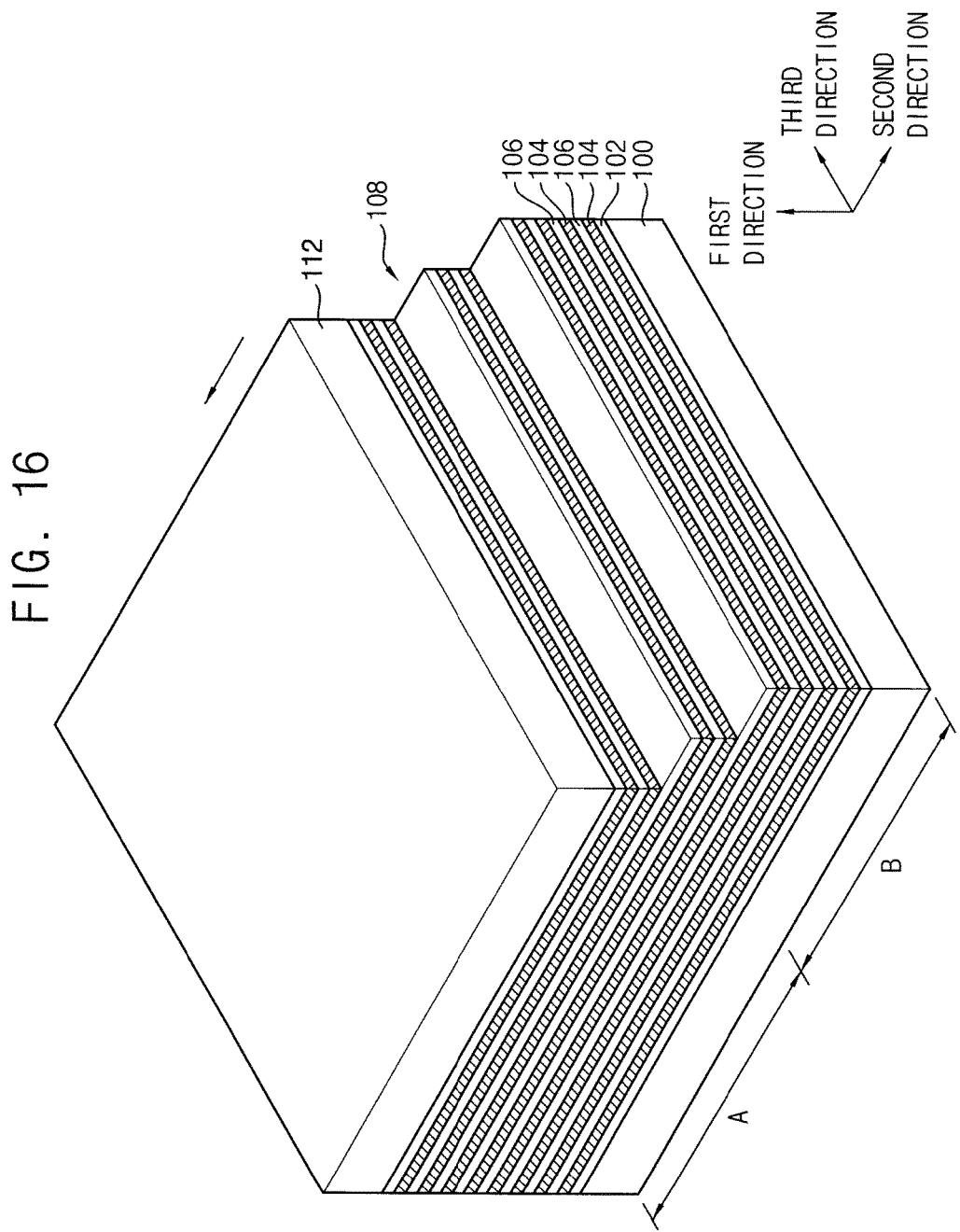

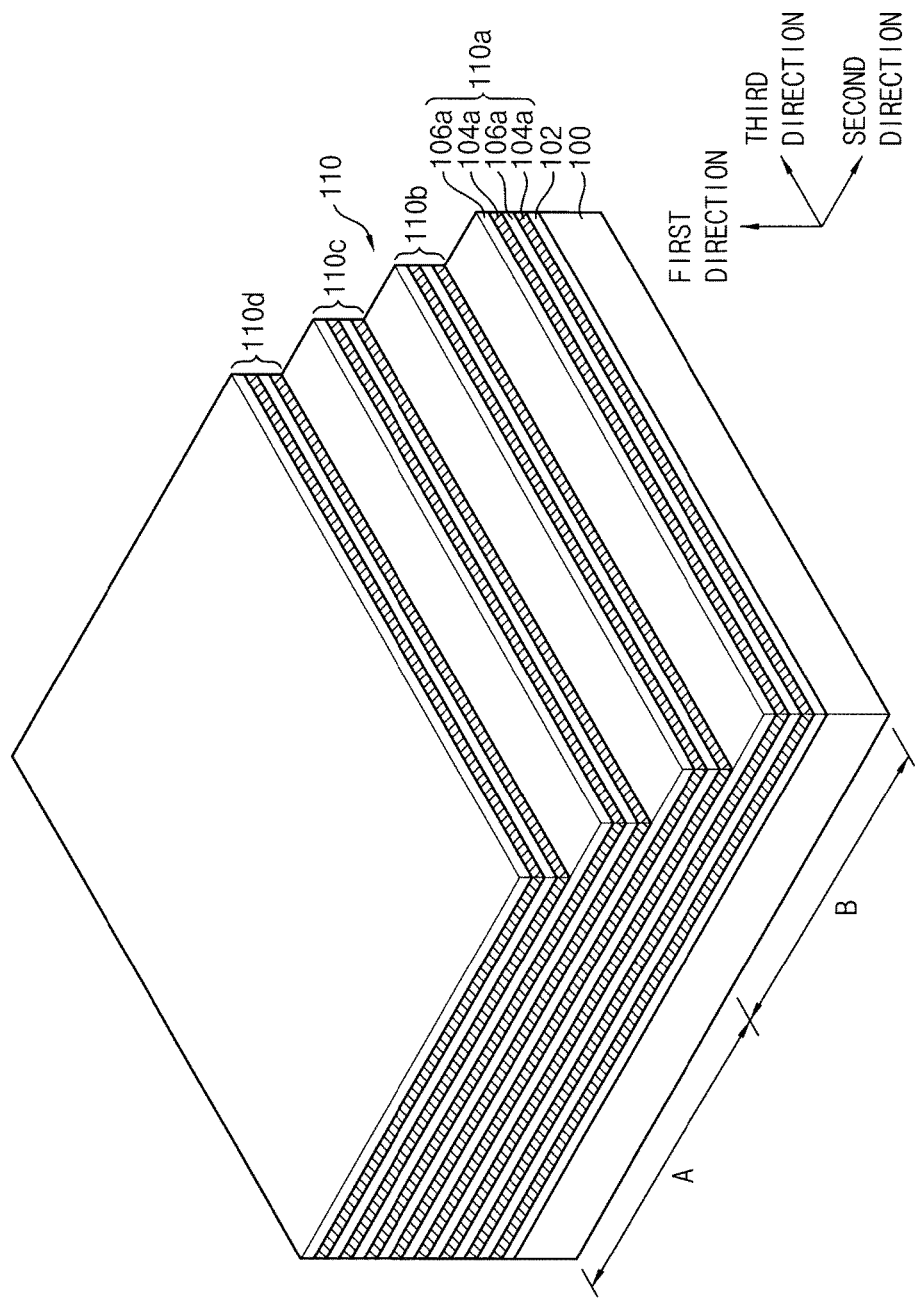

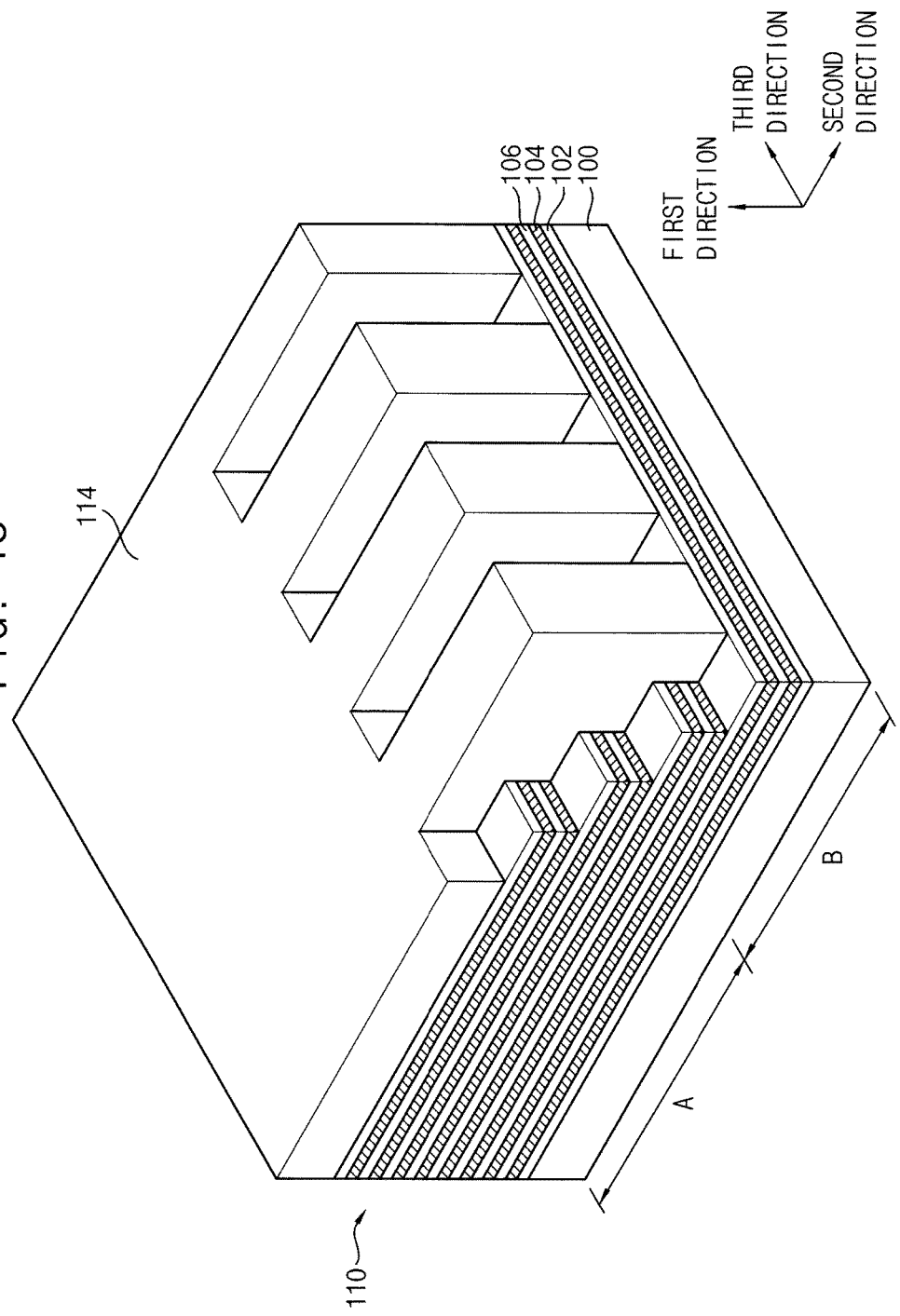

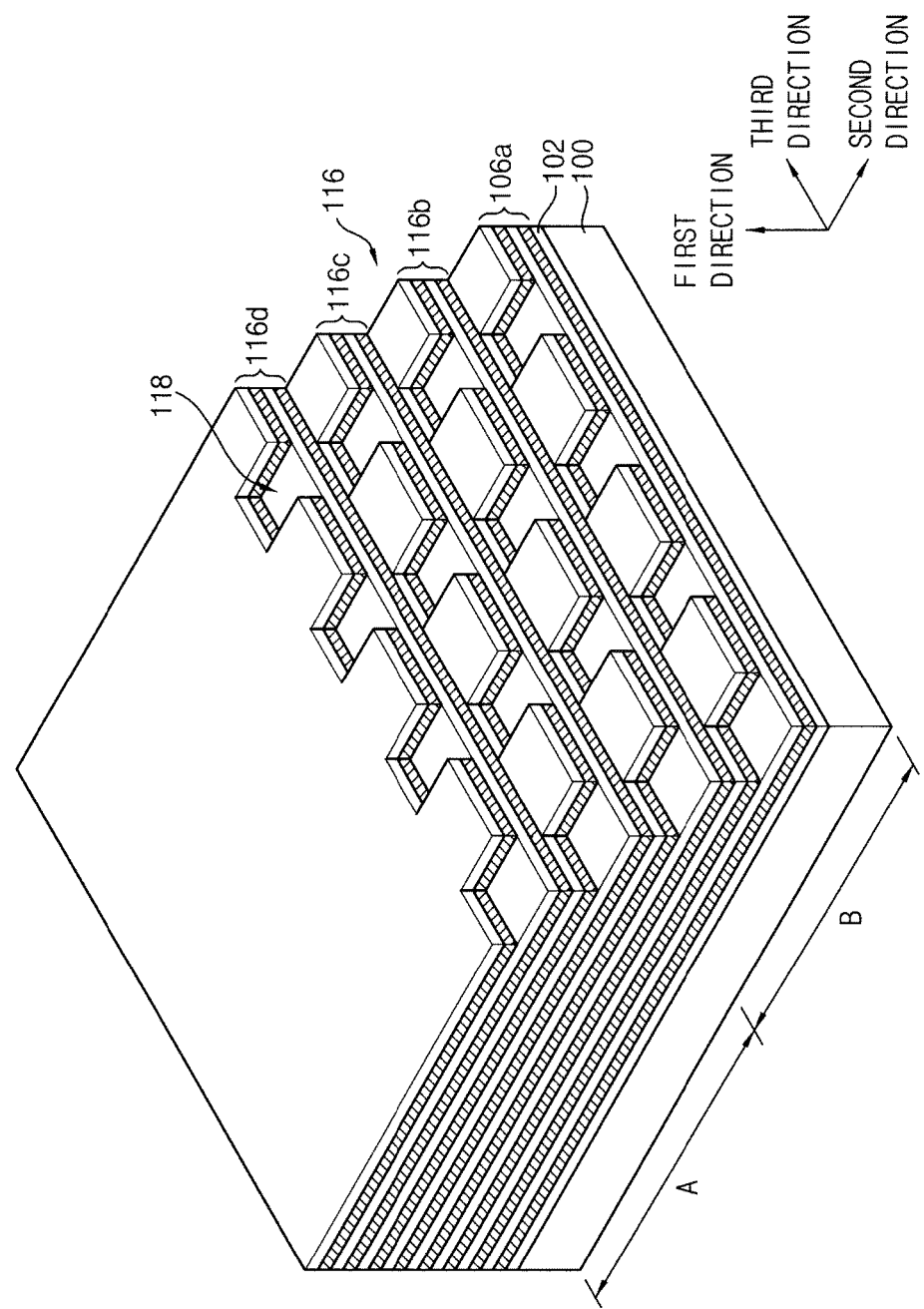

PAD STRUCTURES AND WIRING STRUCTURES IN A VERTICAL TYPE SEMICONDUCTOR DEVICE

CROSS-REFERENCE TO RELATED APPLICATION

This is a Continuation Application of U.S. application Ser. No. 14/156,827, filed on Jan. 16, 2014, which claims the benefit of priority under 35 USC § 119 to Korean Patent Application No. 10-2013-0005317 filed on Jan. 17, 2013 in the Korean Intellectual Property Office (KIPO), the entire disclosure of each of the above-referenced applications is incorporated herein by reference.

BACKGROUND

1. Field

Example embodiments relate to pad structures and wiring structures in a vertical type semiconductor device. More particularly, example embodiments relate to step shape pad structures and/or wiring structures in a vertical type nonvolatile memory device.

2. Description of the Related Art

Recently, vertical semiconductor devices including vertically arranged memory cells in three dimensions have been suggested for accomplishing high integration degrees. Because the vertical semiconductor devices may have a stacked structure of memory cells in a vertical direction, electric signals may be applied to each of the cells stacked in the vertical direction. Thus, pad structures and wiring structures for applying the electric signals to the cells may be very complicated.

SUMMARY

An example embodiment provides a pad structure of a vertical type semiconductor device capable of being formed by a simplified process.

Another example embodiment provides a wiring structure including the pad structure.

According to an example embodiment, there is provided a pad structure of a vertical type semiconductor device including a first conductive line having a first line shape and including first pad regions at an upper surface of an edge portion, and a second conductive line having a second line shape and spaced apart from the first conductive line, the second conductive line being on the first conductive line. An end portion of the first conductive line is extended to a first position. Second pad regions are on an upper surface of an edge portion of the second conductive line. An end portion of the second conductive line has a line shape extended to the first position. The second conductive line defines a dent portion exposing a portion of the first pad regions in a vertical direction.

In example embodiments, the first and second conductive lines may form a stepped layer. The pad structure may include a plurality of the stepped layers vertically stacked in a first direction.

In example embodiments, a length of an upper stepped layer may be shorter than a length of an underlying stepped layer in the stacked stepped layers.

In example embodiments, the dent portion included in the second conductive line may have a recess or an aperture.

According to another example embodiment, there is provided a wiring structure of a vertical type semiconductor device including a first stepped layer structure including a first word line and a second word line spaced apart from each other. The first word line and the second word line are stacked one on another in a first direction which is a vertical direction, and a second stepped layer structure including a third word line and a fourth word line. The second stepped layer structure is provided on the first stepped layer structure. The third and fourth word lines have a line shape extending in the second direction. The first and second word lines have the line shape extending in a second direction. The second word line defines a first dent portion at an edge portion. The first dent portion exposes at least a portion of an upper surface of the first word line. The fourth word line defines a second dent portion at an edge portion. The second dent portion exposes at least a portion of an upper surface of the third word line. A length of the second stepped layer structure is shorter than a length of the first stepped layer structure. The wiring structure also includes a first contact plug contacting the upper surface of the first word line exposed through the first dent portion, a second contact plug contacting an upper surface of the second word line, a third contact plug contacting the upper surface of the third word line exposed through the second dent portion, and a fourth contact plug contacting an upper surface of the fourth word line In example embodiments, third to n-th stepped layer structures (wherein n is a natural number greater than 2) vertically stacked in the first direction on the second stepped layer structure. The third to n-th stepped layer structures each may have a step shape on the second stepped layer. The third to n-th stepped layer structures may each include an upper stepped layer and a lower stepped layer. A length of the upper stepped layer may be shorter than a length of the lower stepped layer.

In example embodiments, the wiring structure may include a plurality of step shape structures, each including the first stepped layer structure stacked on the second stepped layer structure. The plurality of the step shape structures may be parallel to each other and extend in the second direction.

In example embodiments, the wiring structure may further include first to fourth wiring lines electrically coupled to the first to fourth contact plugs, respectively.

In example embodiments, the first and second contact plugs may be on the first stepped layer structure in a first zigzag pattern, and the third and fourth contact plugs may be on the second step layer structure in a second zigzag pattern.

In example embodiments, the first and second contact plugs may be in a row on the first stepped layer, and the third and fourth contact plugs may be in a row on the second stepped layer.

In example embodiments, the wiring structure may include first and second wiring lines at both sides of the first and second contact plugs, a first pad pattern connecting the first wiring line and the first contact plug, a second pad pattern connecting the second wiring line and the second contact plug, third and fourth wiring lines at both sides of the third and fourth contact plugs, a third pad pattern connecting the third wiring line and the third contact plug, and a fourth pad pattern connecting the fourth wiring line and the fourth contact plug.

In example embodiments, the first and second dent portions included in the second and fourth word lines may have a recess or an aperture.

According to example embodiments, there is provided a wiring structure of a vertical type semiconductor device including a first stepped layer structure including first to n-th word lines including a stack of n layers (wherein n is a natural number greater than 1), the first to n-th word lines being spaced apart from each other and stacked one on another in a first direction that is a vertical direction, and a second stepped layer structure over the first stepped layer structure. The second stepped layer structure has a step shape, and the step shape has a gradually decreasing edge length from a lower portion to an upper portion. The first to n-th word lines extend in a second direction. Second to n-th word lines define first dent portions exposing a portion of an edge portion of a first underlying word line. The second stepped layer structure includes first to m-th word lines including a stack of m layers (wherein m is a natural number greater than 2) spaced apart from each other in the vertical direction. The first to m-th word line extend in the second direction. The second to m-th word lines define second dent portions exposing a portion of an edge portion of a second underlying word line. The wiring structure also includes first contact plugs respectively contacting an upper surface of the word lines exposed through the first and second dent portions, and second contact plugs respectively contacting an upper surface of an uppermost word line in each of the first and second stepped layer structures.

In example embodiments, the wiring structure may include a plurality of step shape structures including the first and second stepped layer structures, and the plurality of the step shape structures may be parallel to each other in the first direction and extending in the second direction.

In example embodiments, the wiring structure may further include wiring lines electrically connecting the first contact plugs contacting the word lines formed at a same level layer with the second contact plugs contacting the word lines formed in the same level layer, respectively.

According to still another example embodiment, a wiring structure includes a stack structure. The stack structure includes a plurality of stacked layers spaced apart from each other in a first direction. Each of the stacked layers extends in a second direction substantially perpendicular to the first direction. Each of the stacked layers includes a first conductive layer stacked on a second conductive layer. The stacked layers are staggered in the second direction so as to expose end portions of the first and second conductive layers. The first conductive layer has an edge portion partially exposing an edge portion of the second conductive layer. The wiring structure further includes contact plugs extending in the first direction, the contact plugs contacting the exposed edge portions of the first and second conductive layers, respectively.

The edge portion of the first conductive layer may have at least one protruding portion extending in the second direction. A length of the edge portion of the second conductive layer exposed by the edge portion of the first conductive layer may be equal to or greater than a length of the at least one protruding portion.

The edge portion of the first conductive layer may have at least two protruding portions, and the at least two protruding portions may be spaced apart from each other.

The edge portion of the first conductive layer may have an enclosed opening partially exposing the edge portion of the second conductive layer.

The contact plugs may be arranged either along a same line or in a zigzag pattern in a third direction, the third direction being substantially perpendicular to the first and second directions.

As described above, the pad structure of a vertical semiconductor device in accordance with example embodiments may be formed through a simplified process. In addition, the wiring structure in accordance with example embodiments may have a simple structure. Thus, manufacturing cost for forming the wiring structure may be decreased.

BRIEF DESCRIPTION OF THE DRAWINGS

Example embodiments will be more clearly understood from the following detailed description taken in conjunction with the accompanying drawings. FIGS. 1 to 39 represent non-limiting, example embodiments as described herein.

FIG. 1 is a perspective view illustrating a step shape pad structure of a vertical type semiconductor device in accordance with an example embodiment;

FIG. 2 is a perspective view illustrated for explaining a step shape pad structure of a vertical type semiconductor device in accordance with another example embodiment;

FIG. 3 is a perspective view illustrated for explaining a step shape pad structure of a vertical type semiconductor device in accordance with still another example embodiment;

FIG. 4 is a perspective view illustrated for explaining a step shape pad structure of a vertical type semiconductor device in accordance with a further example embodiment;

FIG. 5 is a perspective view illustrated for explaining a wiring structure of a vertical type semiconductor device in accordance with an example embodiment;

FIG. 6 is a plan view illustrated for explaining a wiring structure of a vertical type semiconductor device in accordance with another example embodiment;

FIG. 8 is a perspective view illustrated for explaining a wiring structure of a vertical type semiconductor device in accordance with still another example embodiment;

FIG. 9 is a plan view illustrated for explaining a wiring structure of a vertical type semiconductor device in accordance with a further example embodiment;

FIG. 11 is a plan view illustrated for explaining a wiring structure of a vertical type semiconductor device in accordance with a still further example embodiment;

FIG. 13 is a plan view illustrated for explaining a wiring structure of a vertical type semiconductor device in accordance with yet another example embodiment;

FIGS. 15 to 22 are perspective views illustrated for explaining a method of forming a step shape pad structure of the vertical type semiconductor device illustrated in FIG. 1;

FIGS. 23 and 24 are perspective views illustrated for explaining other methods for forming a step shape pad structure of a vertical type semiconductor device in FIG. 1;

FIG. 25 is a perspective view illustrated for explaining a step shape pad structure of a vertical type semiconductor device in accordance with an example embodiment;

FIGS. 26 and 27 are perspective views illustrated for explaining a method of forming a step shape pad structure of the vertical type semiconductor device in FIG. 25;

FIGS. 28 and 29 are perspective views illustrated for explaining other method of forming a step shape pad structure of the vertical type semiconductor device illustrated in FIG. 25;

FIGS. 30 and 31 are perspective views illustrated for explaining a method of forming the wiring structures illustrated in FIGS. 5 to 7B;

FIG. 33 is a perspective view illustrated for explaining a step shape pad structure of a vertical type semiconductor device in accordance with still another example embodiment;

FIG. 35 is a perspective view illustrated for explaining a step shape pad structure of a vertical type semiconductor device in accordance with a yet still another example embodiment;

FIG. 36 is a cross-sectional view illustrated for explaining a step shape pad structure of a vertical type semiconductor device in accordance with a still further example embodiment;

FIG. 37 is a cross-sectional view illustrated for explaining a step shape pad structure of a vertical type semiconductor device in accordance with a yet further example embodiment;

FIG. 38 is a perspective view illustrated for explaining a step shape pad structure of a vertical type semiconductor device in accordance with an additional example embodiment; and FIG. 39 is a block diagram illustrating an information processing system in accordance with an example embodiment.

DETAILED DESCRIPTION OF EXAMPLE EMBODIMENTS

Figure 1:
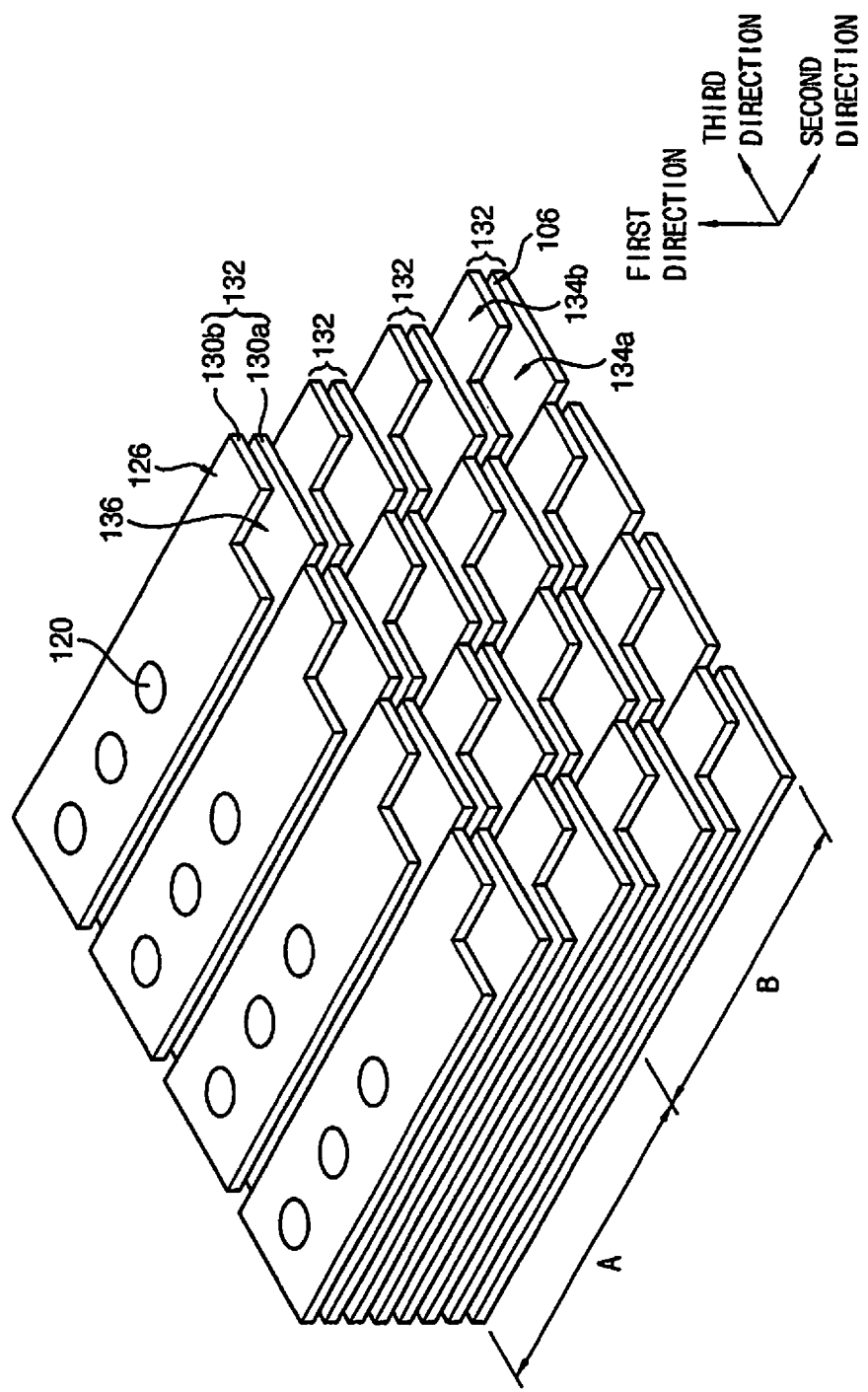

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

FIG. 1 is a perspective view illustrating a step shape pad structure of a vertical type semiconductor device in accordance with an example embodiment.

Hereinafter, a direction perpendicular to the upper surface of a substrate may be defined as a first direction, two directions in parallel to the upper surface of the substrate and perpendicular to each other may be defined as a second direction and a third direction. The second direction may be the extended direction of word lines. In addition, the direction represented by arrows in the drawings may mean both of the arrow direction and the counter direction of the arrow. The definition on the directions may be the same in all of the following drawings.

Figure 22:
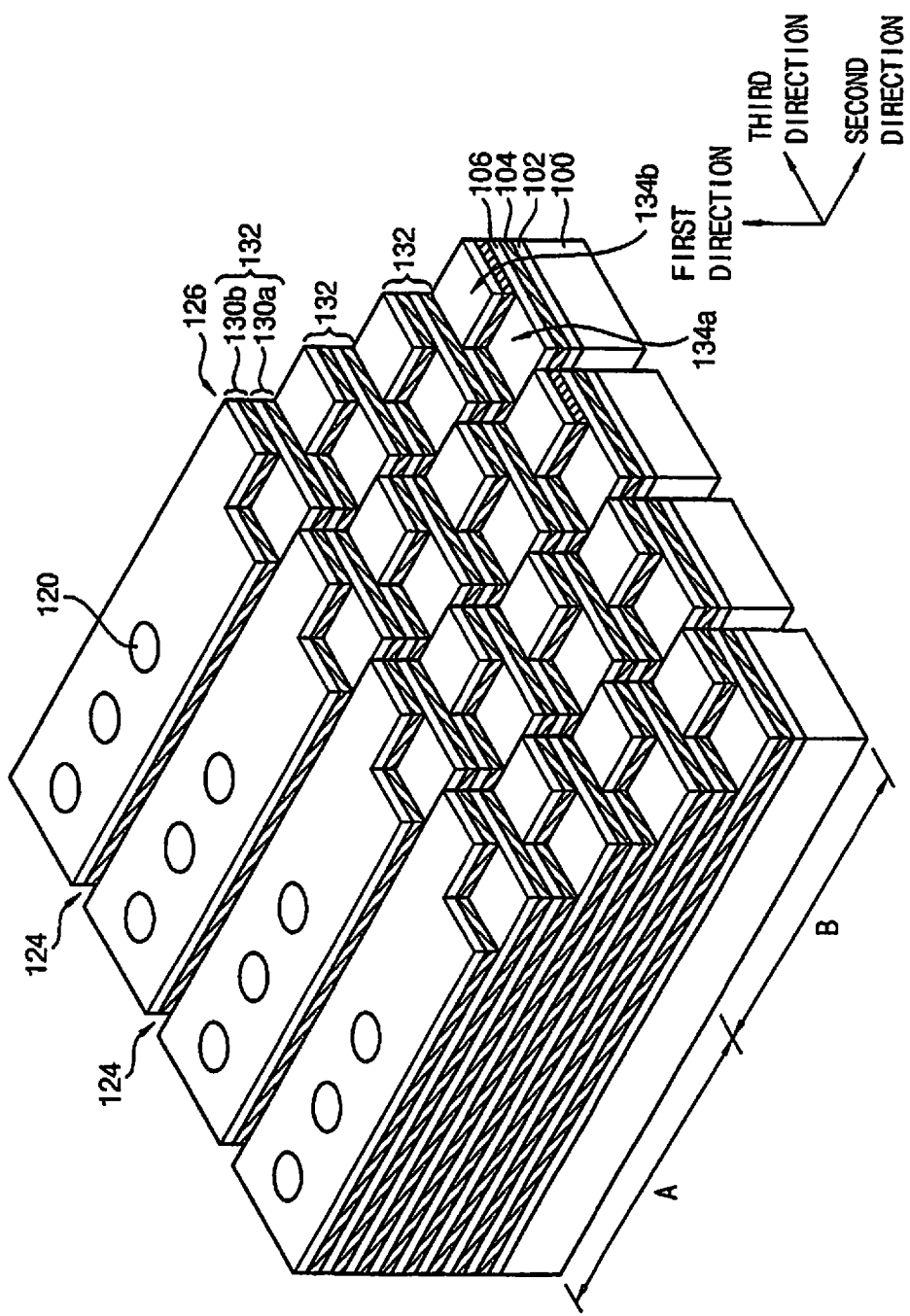

In FIG. 1, a substrate, a first insulating layer, etc. may not be illustrated to clearly show a word line part. In FIG. 22, the substrate and the first insulating layer omitted in FIG. 1 may be shown.

Referring to FIGS. 1 and 22, a substrate (not illustrated) including a cell forming region A for forming memory cells and a wiring forming region B for forming wirings for connecting the cells may be provided. The wiring forming region B may be positioned at both edge portions of the cell forming region A.

On the substrate in the cell region, pillar structures 120 extended in the first direction may be provided. The bottom portion of the pillar structure 120 may make contact with the surface of the substrate. A tunnel insulating layer pattern, a first charge storing layer pattern and a first blocking layer pattern stacked one by one while surrounding the side wall of the pillar structure 120 may be included.

The pillar structure 120 may include a cylinder type channel pattern filled with a material, or a hollow cylinder type channel pattern (for example a macaroni shape channel pattern). When the channel pattern has a macaroni shape, an inner portion of the channel pattern may be filled up with an insulating material. In addition, the lower portion of the pillar structure 120 directly contacting with the surface of the substrate may have the cylinder type channel pattern filled with a material, and the upper portion of the pillar structure 120 may have the hollow cylinder type channel pattern. The pillar structure 120 may include a channel pattern and may be designed in various shapes. Thus, the pillar structure 120 may not be limited to the above-described structure.

On the substrate 100, a pad insulating layer 102 may be provided.

On the pad insulating layer 102, word lines 130a and 130b spaced apart to each other in the first direction may be provided. Between the word lines 130a and 130b, first insulating layers 106 may be inserted. That is, the word lines 130a and 130b and the first insulating layers 106 may be alternately stacked. The word lines 130a and 130b may be insulated by the first insulating layers 106 in the first direction.

The word lines 130a and 130b may surround the pillar structures 120 and may be extended in the second direction. That is, the pillar structure 120 may have a penetrating shape through the word lines 130a and 130b. Particularly, the word lines 130a and 130b may be formed on a blocking layer pattern of the pillar structure. In addition, the word lines 130a and 130b may have a shape extended in the second direction from the cell forming region A to the wiring forming region B. The word lines 130a and 130b may include a conductive material. Examples of the conductive material used for the word lines 130a and 130b may include a metal material, a conductive semiconductor material, a metal nitride, etc.

The alternately stacked structure of the word lines 130a and 130b and the first insulating layers 106 in the first direction may be called as a word line structure. The word line structure may be repeatedly arranged in parallel to each other in the third direction.

The word lines 130a and 130b in the cell forming region A may be provided as the control gate of each cell and the gate of a selection transistor.

The vertical type semiconductor device having the above-described structure may be a NAND flash memory device. The lowest and the uppermost transistors of the pillar structure may be provided as selection transistors. In addition, cell transistors may be connected between the selection transistors in the structure.

The word lines 130a and 130b in the wiring forming region B may be provided as pad regions for forming wirings. Hereinafter, the edge portion of the word line positioned in the connection region may be called a pad structure 126.

The pad structure 126 may have a step shape. That is, the pad structure 126 may include a plurality of stepped layers 132. From the upper portion to the lower portion, the pad structure 126 may be extended further in the second direction. The lower portion of the pad structure 126 may be extruded further to a side portion when compared with that in the upper portion.

In the pad structure 126, at least two word lines may be stacked in the vertical direction at one stepped layer 132. That is, at least two word lines 130a and 130b, and two of first insulating layers 106 positioned between the word lines 130a and 130b may be included in one stepped layer 132. In example embodiments, two word lines 130a and 130b may be stacked at one stepped layer 132. Hereinafter, the word line positioned at the lower portion in one stepped layer 132 may be called as a first word line 130a, and the word line positioned at the upper portion may be called as a second word line 130b. As described above, because two word lines 130a and 130b may be stacked in one stepped layer 132, four stepped layers 132 may be provided when eight word lines are stacked as illustrated in the drawings.

In addition, when viewing the word lines 130a and 130b positioned in one stepped layer 132 from the upper surface, at least a portion of the upper portion of each word line may not be overlapped. Thus, the first and second word lines 130a and 130b included in one stepped layer 132 may have different edge shapes to each other.

In example embodiments, the second word line 130b may include (or define) a dent portion 136 formed by the etching of a portion of the end portion thereof, and may include an unetched portion extruding from a side direction. The dent portion 136 may have on opened shape of a portion of the side wall thereof. For example, the dent portion 136 may be shaped in the form of a "L". Hereinafter, the dent portion 136 having the above-described shape will be called as an opened dent portion.

That is, the second word line 130b may include a dent portion 136 at the front portion in the third direction, and have a rear portion having an extruding shape to a side. The dent portion 136 may have opened shapes of two edge portions. Thus, one of the second word lines may include one extruding portion.

However, the first word line 130a may not include the dent portion and may have an extended shape to the extruding portion of the second word line. Thus, a portion of the upper surface of the first word line 130a may be unshielded by the second word line 130b, through the dent portion 136 of the second word line. In this case, the first insulating layer 106 may remain on the upper portion of the first word line 130a.

The extruding portion in the second word line 130b may be provided as a second pad region 134b. In addition, in the first word line 130a, the exposed portion by the dent portion 136 may be provided as a first pad region 134a. The first and second pad regions 134a and 134b may have sufficient upper areas for contacting contact plugs for electrical wiring.

The edge portions of the word line structures may have the shape of the step shape pad structure 126. That is, each of the word line structures arranged in parallel in the third direction may have the same shape. Thus, each of the word line structures arranged in parallel in the third direction may have step shape pad structure 126 of the same shape.

Even though not illustrated, the step shape pad structure 126 may be covered with an upper insulating interlayer.

In FIG. 1, the step shape pad structure is shown to be disposed only at one edge portion. Alternatively, the step shape pad structure having the same shape may be also disposed at the facing edge portion of the step shape pad structure. That is, the step shape pad structures may be disposed at both sides in the second direction.

Figure 2:
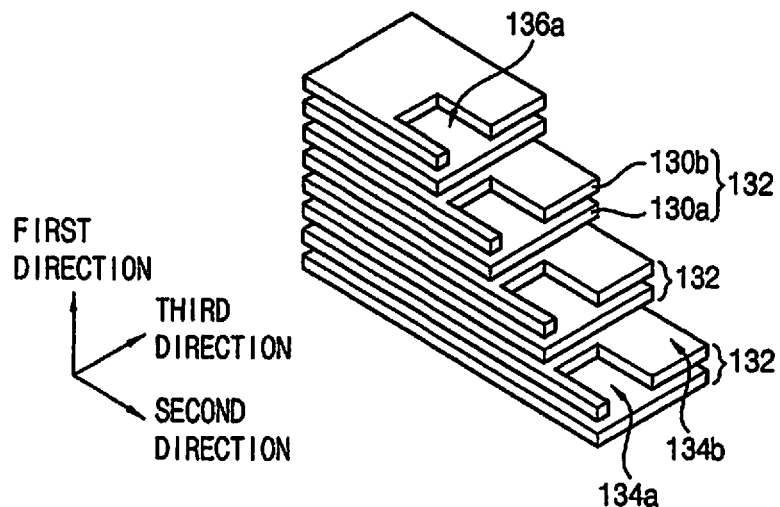

FIG. 2 is a perspective view illustrated for explaining a step shape pad structure of a vertical semiconductor device in accordance with another example embodiment.

The step shape pad structure in FIG. 2 may be the same as the step shape pad structure shown in FIG. 1 except for the word line shape of the pad region. Thus, an overlapping part with the explanation referring to FIG. 1 will be omitted. In FIG. 2, only one of step shape pad structures may be illustrated, however, the same pad structures may be disposed in parallel in the third direction.

Referring to FIG. 2, in the step shape pad structure, at least two word lines 130a and 130b may be stacked in the first direction at one stepped layer 132. In example embodiments, the one stepped layer may include two stacked word lines 130a and 130b.

The second word line 130b positioned at the upper portion of the stepped layer 132 may include an opened dent portion 136a formed by etching of the edge portion of the second word line 130b, and may include an unetched portion having an extruding shape to a side. In the second word line 130b, a dent portion 136b may be included at the front portion in the third direction, and an extruding shape may be formed in the front and the rear of the dent portion 136a. The dent portion 136a may include one opened edge portion. The opened portion of the dent portion 136a may correspond to the end portion of the word line in the second direction. Thus, two extruding portions may be included at both sides of the dent portion 136a in one second word line.

Meanwhile, the first word line 130a may not be provided with the dent portion 136a, and the second word line 130b may have an extending shape to the extruding portion of the second word line 130b. Thus, a portion of the upper surface of the first word line 130a may not be shielded by the second word line 130b through the dent portion 136a of the first word line 130a.

The extruding portion of the second word line 130b may be provided as a second pad region 134b. In addition, in the first word line, the exposed portion by the dent portion 136a may be provided as a first pad region 134a. The first and second pad regions 134a and 134b may be required to have sufficient upper areas so as to make contacts with contact plugs for electrical wiring.

Figure 3:
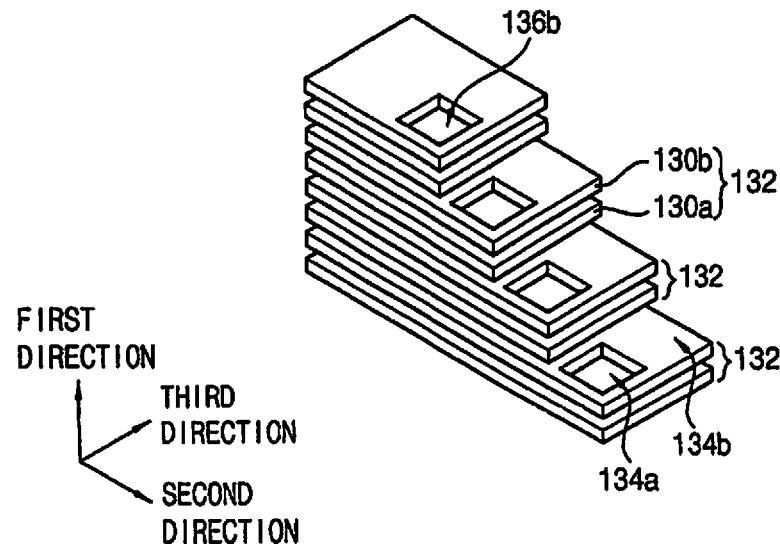

FIG. 3 is a perspective view illustrated for explaining a step shape pad structure of a vertical type semiconductor device in accordance with still another example embodiment.

The pad structure in FIG. 3 may have the same structure as the step shape pad structure illustrated in FIG. 1 except for the word line shape in the pad region. Thus, the repeated explanation with that referring to FIG. 1 will be omitted. In FIG. 3, only one of pad structures may be illustrated, however, the same pad structures may be arranged in parallel in the third direction.

Referring to FIG. 3, in the pad structure, at least two word lines 130a and 130b may be stacked in the vertical direction at one stepped layer 132. In example embodiments, the one stepped layer 132 may include two stacked word lines 130a and 130b.

The second word line 130b positioned at the upper portion in the stepped layer 132 may include a closed opening portion 136b at the edge portion, that is, a hole shape opening portion 136b (or, alternatively, an aperture 136b). The upper surface of the edge portion of the second word line 130b excluding the opening portion 136b may be provided as the second pad region 134b.

The first word line 130a may not include the opening portion 136b and may have an extending shape to the end portion of the second word line 130b. Thus, through the opening portion of the second word line 130b, a portion of the upper surface of the first word line 130a may not be shielded by the second word line 130b. The upper surface of the first word line 130a exposed through the opening portion 136b may be provided as the first pad region 134a.

The first and second pad regions 134a and 134b may be required to have sufficient upper areas so as to make contacts with contact plugs for electrical wiring.

Figure 4:
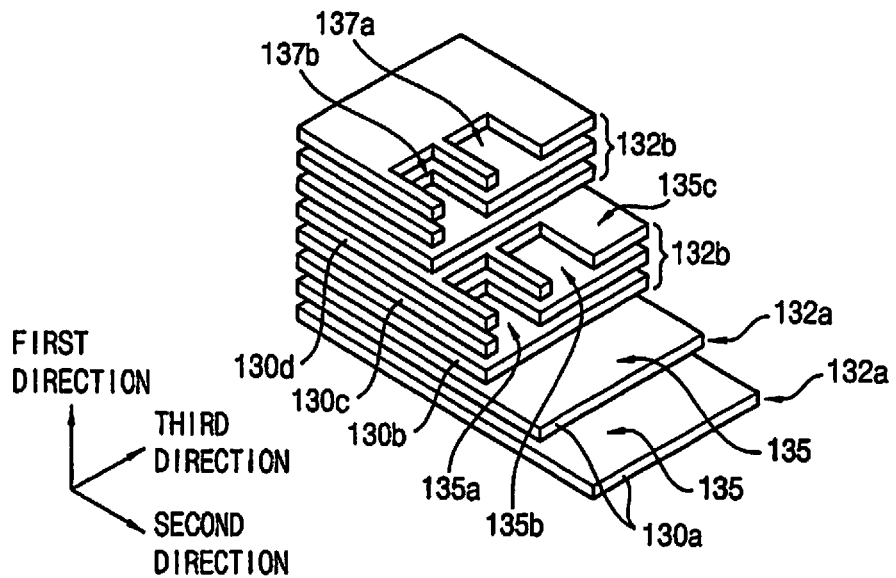

FIG. 4 is a perspective view illustrated for explaining a step shape pad structure of a vertical semiconductor device in accordance with a further example embodiment.

In FIG. 4, only one of step shape pad structures may be illustrated, however, the same pad structures may be arranged in parallel in the third direction.

Referring to FIG. 4, one or more word lines 130a to 130d may be stacked at one stepped layer 132a or 132b in the vertical direction. Each of the stepped layers 132a and 132b may include the same number of the word lines 130a to 130d, or may include different numbers of the word lines 130a to 130d.

In example embodiments, as illustrated in the drawing, first and second stepped layers 132a from the lowest portion of the step shape pad structure may include one layer of the word line 130a. In addition, at the third and fourth stepped layers 132b, three layers of the word lines 130b to 130d may be included. In the step shape pad structure, the stacking number of the word lines included in one stepped layer may not be limited.

Because the first and second stepped layers 132a may include only one layer of the word line 130a, the dent portion may not be formed at the edge portion of the word line 130a included in the first and second stepped layers 132a.

Because the third and fourth stepped layers 132b may be included in three word lines 130b to 130d, each of the word lines 130b to 130d included in the third and fourth stepped layers 132b may have different shapes. Hereinafter, the word lines in the third and fourth stepped layers may be called as first to third word lines 130b to 130d from the lowest in each of the third and fourth stepped layers. Further, the first and second stepped layers 132a may be called as lower stepped layers and the third and fourth stepped layers may be called as upper stepped layers.

The uppermost word line in each of the upper stepped layer may include one less dent portions than the number of the word lines included in each of the upper stepped layer. Thus, the third word line 130d may include two dent portions 137a and 137b. The third word line 130d may include first and second dent portions 137a and 137b.

The second word line 130c may include one dent portion. The one dent portion 137b may be disposed to overlap with one of the first and the second dent portions 137a and 137b of the third word line 130d. Particularly, the dent portion 137b included in the second word line 130c may be overlapped with the second dent portion 137b of the third word line. Thus, a portion of the upper surface at the edge portion of the second word line 130c may be exposed through the second dent portion 137b of the third word line 130d. The upper surface of the exposed edge portion of the second word line 130c may be provided as the second pad region 135b.

The first word line 130b may not include the dent portion, and may have an extending shape to the end portion of the second and third word lines. Thus, through the overlapped dent portions 137a and 137b in the second and third word lines, a portion of the upper surface of the first word line 130b may not be shielded but may be exposed by the second and third word lines. The exposed upper surface of the first word line 130b may be provided as a first pad region 135a.

The first to third pad regions 135a to 135c may be required to have sufficient upper areas so as to make contacts with contact plugs for electrical wiring.

In FIG. 4, each of the dent portions included in the second and third word lines may be illustrated to have the same structure as that in FIG. 2. However, the shape of the dent portions included in the second and third word lines may not be limited to this shape. Particularly, the shape of the dent portions included in the second and third word lines may be the same as that illustrated in FIG. 1 or in FIG. 3.

As described in the above example embodiments, the vertical semiconductor device in accordance with example embodiments may have a step shape pad structure including less numbers of stepped layers than the stacked numbers of the word lines. In the pad structure having the above structure, an optimization of wiring for an electric connection of the word lines in each layer to each other may be necessary. Hereinafter, the optimized wiring structure will be explained.

In the following drawings, the wiring structure may be formed on the pad structure illustrated in FIG. 2. However, the pad structure for forming the wiring structure may not be limited to the structure illustrated in FIG. 2. That is, the wiring structures in accordance with example embodiments may be applied to all of the vertical type semiconductor devices including a step shape pad structure including less numbers of the stepped layers than the stacking number of the word lines.

Thus, the dent portion 136 described in FIG. 1 is intended to encompass the opened dent portion 136a shown in FIG. 2, the closed opening portion 136b shown in FIG. 3, and the two dent portions 137a and 137b shown in FIG. 4.

Figure 5:
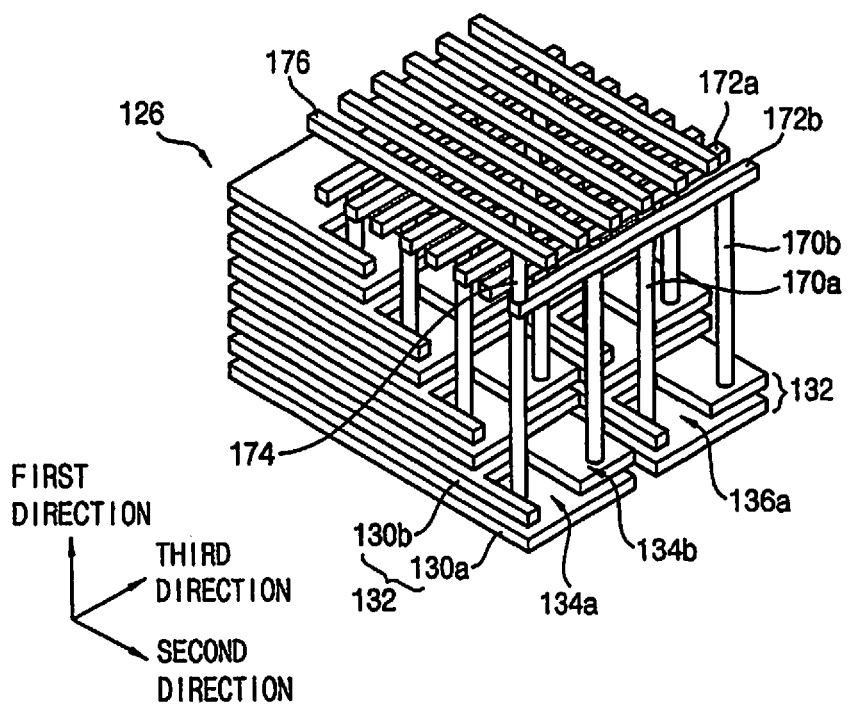
Figure 6:
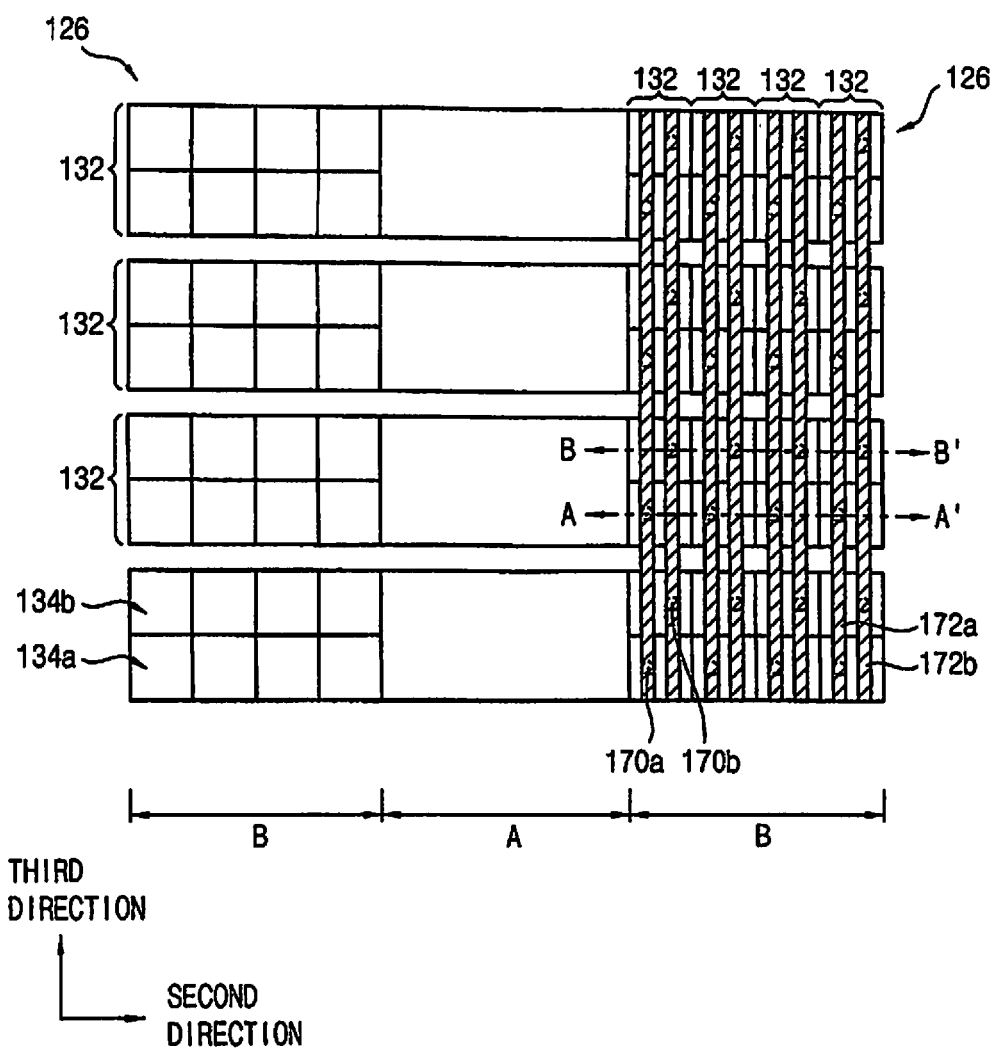
Figure 7A:
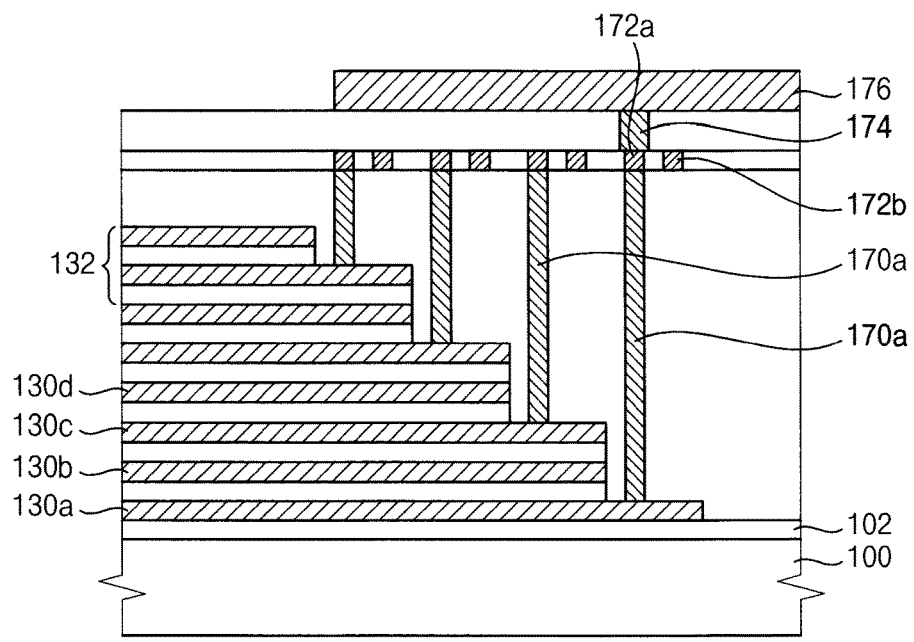
FIGS. 7A and 7B are cross-sectional views illustrated for explaining a wiring structure of a vertical type semiconductor device in accordance with the another example embodiment.
Figure 7B:
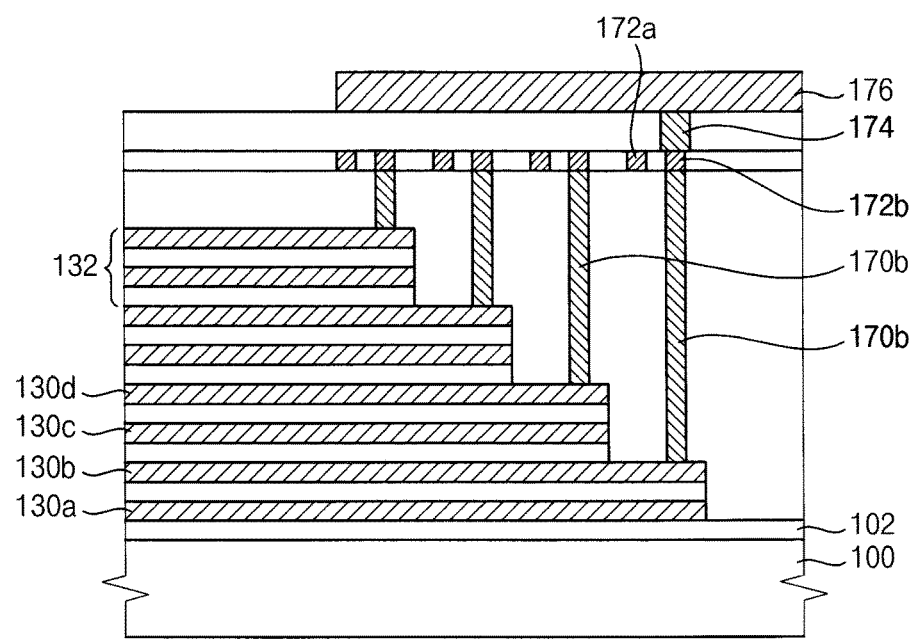

FIG. 5 is a perspective view illustrated for explaining a wiring structure of a vertical type semiconductor device in accordance with an example embodiment. FIG. 6 is a plan view illustrated for explaining a wiring structure of a vertical type semiconductor device in accordance with another example embodiment. FIGS. 7A and 7B are cross-sectional views illustrated for explaining a wiring structure of a vertical type semiconductor device in accordance with the another example embodiment.

In FIG. 6, an upper contact plug and an upper plug may be omitted for brevity.

As illustrated in the plan view of FIG. 6, the step shape pad structure 126 may be symmetrically provided at both sides of a cell region. However, the wiring structures may not be provided at each of the step shape pad structures 126 at both sides of the cell region, respectively. The wiring structure may be formed only at one side of the step shape pad structure 126. In example embodiments, the wiring structure may be provided at the step shape pad structure 126 disposed at one edge portion among the step shape pad structures 126 provided at both sides. As described above, when the wiring structure is formed only at one edge portion, circuits connecting the wiring structure may be concentrated in one region. In this case, the layout of the circuit designs may be simplified.

Referring to FIGS. 5 and 6, an upper insulating interlayer (not illustrated) covering the step shape pad structure 126 may be provided. A wiring structure connecting each of the pad regions of the pad structure 126 may be provided at the inner portion and the upper portion of the upper insulating interlayer. The wiring structure may include first and second contact plugs 170a and 170b, first and second wiring lines 172a and 172b, an upper contact plug (not illustrated) and an upper wiring (not illustrated).

The first and second contact plugs 170a and 170b may contact the first and second pad regions 134a and 134b through the upper insulating interlayer. The first contact plugs 170a may contact the first pad region 134a in one stepped layer 132. The second contact plugs 170b may contact the second pad region 134b in the one stepped layer 132.

The first contact plugs 170a positioned in the same stepped layer 132 may be arranged in parallel in the third direction. In addition, the second contact plugs 170b positioned at the same stepped layer 132 may be arranged in parallel in the third direction. The first and second contact plugs 170a and 170b positioned in the same stepped layer 132 may not be arranged in parallel in the third direction, but may be disposed in a zigzag shape. Thus, the first and second contact plugs 170a and 170b may be deviated from the center portion of the first and second pad regions 134a and 134b, respectively.

On the first contact plugs 170 positioned at the same level stepped layers 132, a first wring line 172a may be provided. That is, the first contact plugs 170a positioned at the same level stepped layers may electrically connect with each other by the first wiring line 172a. The first wiring line 172a may have an extending shape to the third direction.

In addition, on the second contact plugs 170b positioned at the same level stepped layers 132, a second wiring line 172b may be provided. That is, the second contact plugs 170b positioned at the same level stepped layer may be electrically connect with each other by the second wiring line 172b. The second wiring line 172b may have an extending shape in the third direction.

Because the first and second contact plugs 170a and 170b may be disposed in a zigzag shape in the third direction, the first and second wiring lines 172a and 172b may be spaced apart by a certain distance. In addition, the first and second wiring lines 172a and 172b may be alternately disposed.

FIG. 7A is a cross-sectional view taken along A-A' in FIG. 6, and FIG. 7B is a cross-sectional view taken along B-B' in FIG. 6. That is, FIG. 7A may be obtained by cutting along the first pad region portion in the second direction, and FIG. 7B may be obtained by cutting along the second pad region portion in the second direction.

In FIG. 7A, first contact plugs 170a making a contact with the first pad region 134a may be provided. The first contact plugs 170a may contact the first wiring lines 172a. In addition, on the first wiring line 172a, an upper contact plug 174 and an upper conductive line 176 may be provided.

In FIG. 7B, second contact plugs 170b contacting the second pad region 134b may be provided. The second contact plugs 170b may contact the second wiring lines 172b. In addition, on the second wiring line 172b, an upper contact plug 174 and an upper conductive line 176 may be provided.

The upper contact plug 174 and the upper conductive line 176 may be wirings for an electric connection again of the first and second wiring lines 172a and 172b, respectively contacting the pad region in the same level stepped layers.

The upper contact plug 174 may contact the upper surface of the first and second wiring lines 172a and 172b, respectively contacting the pad region in the same level stepped layers. The upper conductive line 176 may have a line shape contacting the upper surface of the upper contact plug 174, while being extended in the second direction. Thus, the upper contact plug 174 and the upper conductive line 176 may be provided at least as much as the same number of the stacking number of the word lines 130a and 130b. The upper conductive lines 176 for connecting each layer may be arranged in parallel with a distance from each other.

Figure 8:
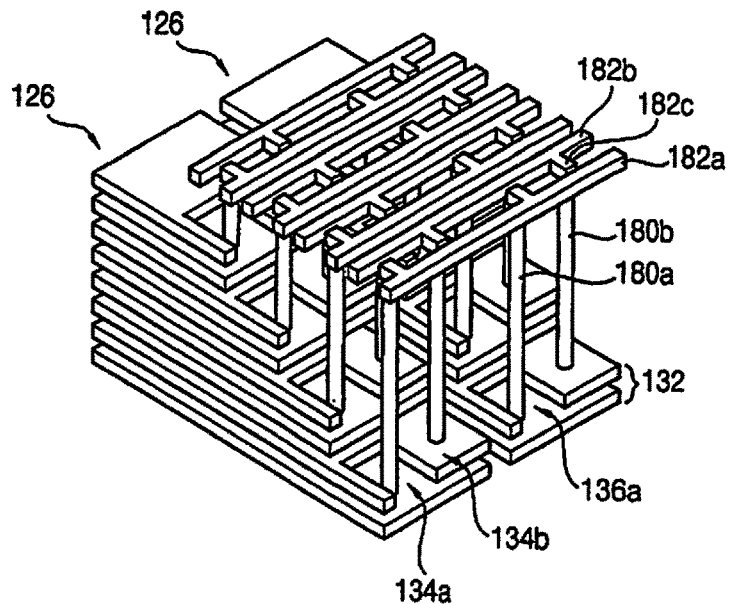
Figure 9:
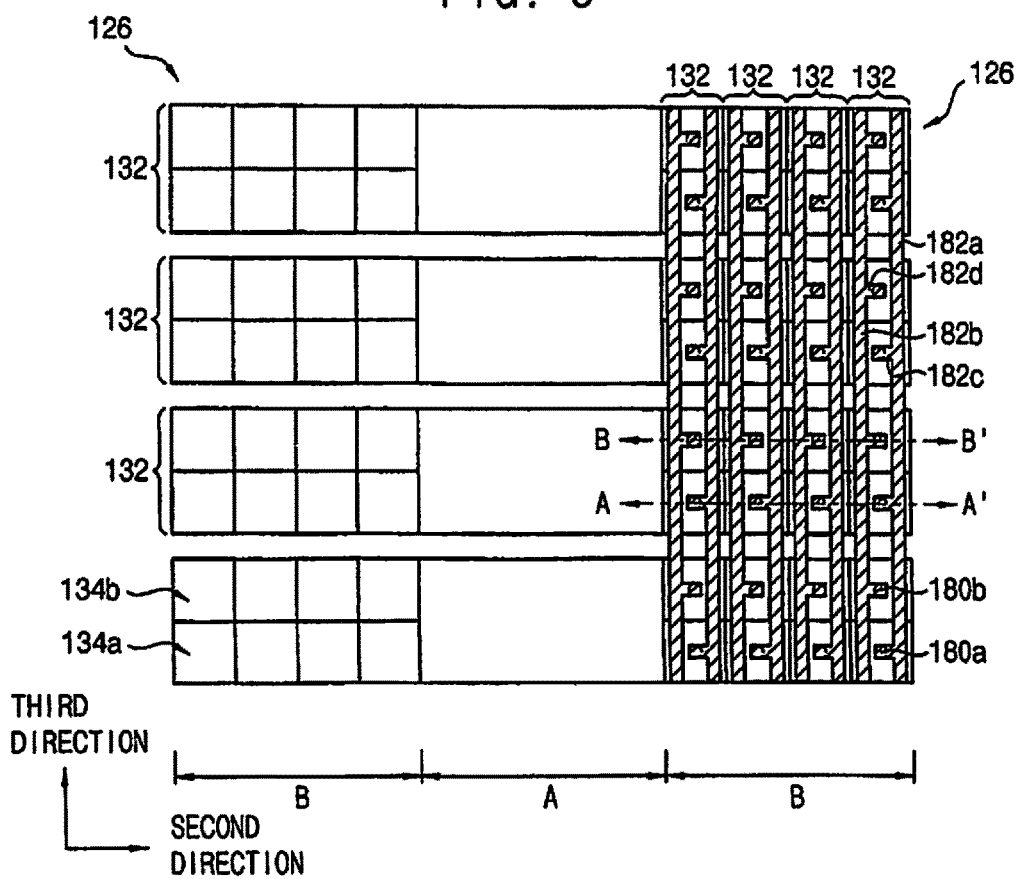
Figure 10A:
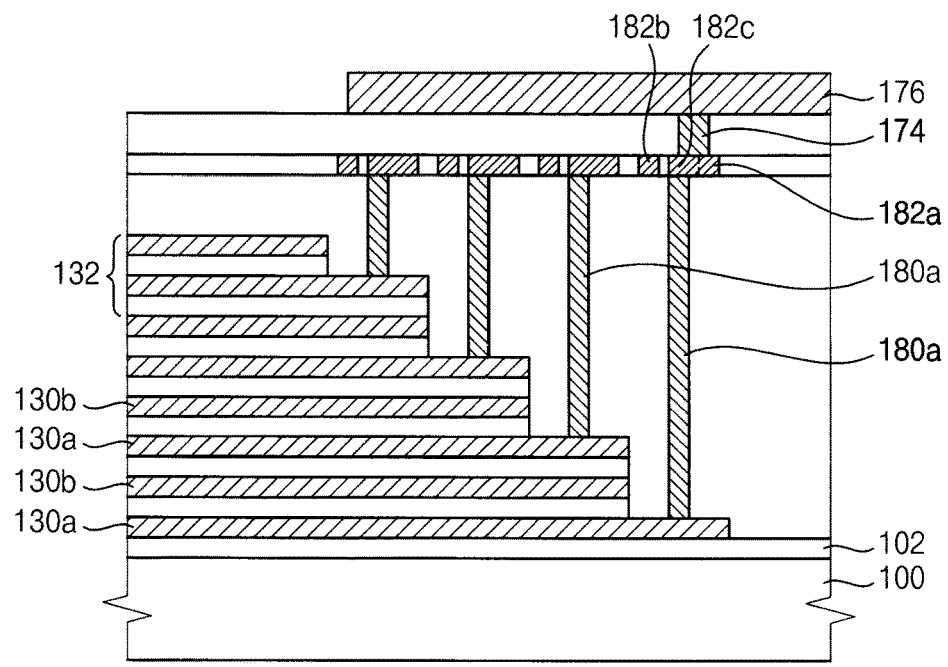
FIGS. 10A and 10B are cross-sectional views illustrated for explaining a wiring structure of a vertical type semiconductor device in accordance with the further example embodiment.
Figure 10B:
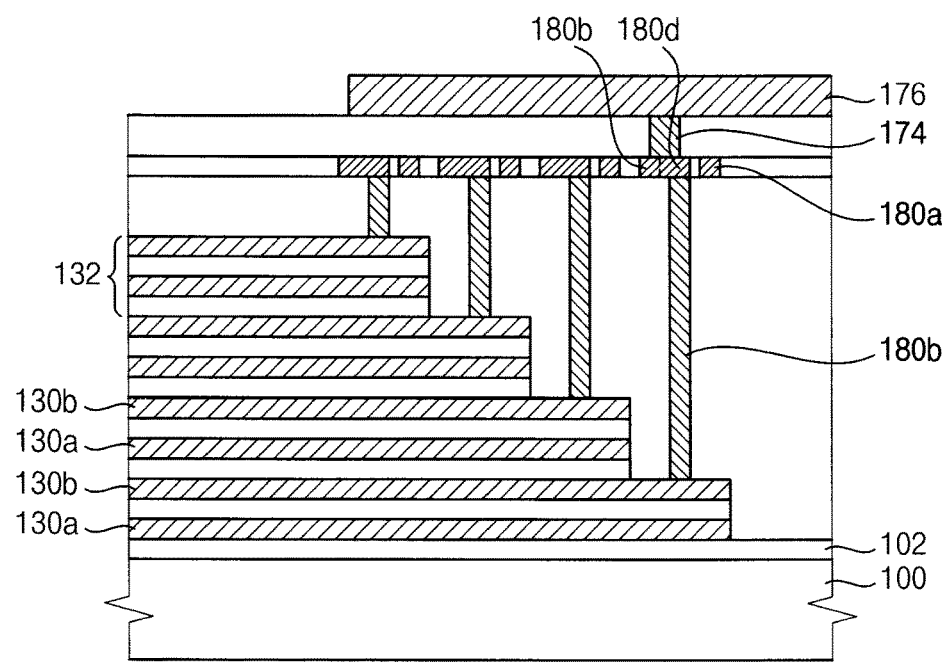

FIG. 8 is a perspective view illustrated for explaining a wiring structure of a vertical type semiconductor device in accordance with still another example embodiment. FIG. 9 is a plan view illustrated for explaining a wiring structure of a vertical type semiconductor device in accordance with a further example embodiment. FIGS. 10A and 10B are cross-sectional views illustrated for explaining a wiring structure of a vertical type semiconductor device in accordance with the further example embodiment.

In FIGS. 8 and 9, an upper contact plug and an upper wiring may be omitted for the brevity.

As illustrated in the plan view of FIG. 9, the step shape pad structure may be provided at both sides of a cell forming region A. In example embodiments, the wiring structure may be provided at only the step shape pad structure positioned at one edge portion among both edge portions of the step shape pad structure.

Referring to FIGS. 8 and 9, first contact plugs 180a may be disposed in the first pad region 134a in one stepped layer 132 in the step shape pad structure. In addition, second contact plugs 180b may be disposed in the second pad region 134b in one stepped layer 132.

The first and second contact plugs 180a and 180b positioned at the same level stepped layer 132 may be arranged in parallel to each other in the third direction. That is, the first and second contact plugs 180a and 180b positioned at the same level stepped layers 132 may not be disposed in a zigzag shape. Thus, the first and second contact plugs 180a and 180b may be positioned at the center portion of the first and second pad regions 134a and 134b, respectively.

A first pad patterns 182c may be provided on the first contact plugs 180a positioned at the same level stepped layers 132. A first wiring line 182a contacting the side wall of the first pad patterns 182c arranged in parallel in the third direction, while being extended in the third direction may be provided. That is, the first contact plugs 180a positioned at the same level stepped layers 132 may be electrically connected with each other by the first pad pattern 182c and the first wiring line 182a.

On the second contact plugs 180b positioned at the same level stepped layers 132, second pad patterns 182d may be provided. In addition, a second wiring line 182b contacting the side wall of the second pad patterns 182d arranged in parallel in the third direction, while being extended in the third direction may be provided.

The first and second pad patterns 182c and 182d may be provided so that the first and second wiring lines 182a and 182b may be spaced apart to each other and may make an electric connection, respectively with the first and second contact plugs 180a and 180b. The first and second wiring lines 182a and 182b may be positioned between the first and second contact plugs 180a and 180b.

FIG. 10A is a cross-sectional view taken along A-A' in FIG. 9, and FIG. 10B is a cross-sectional view taken along B-B' in FIG. 9. That is, FIG. 10A may be obtained by cutting along the first pad region portion in the second direction, and FIG. 10B may be obtained by cutting along the second pad region portion in the second direction.

In FIG. 10A, the first contact plugs 180a contacting the first pad region 134a may be provided. The first contact plug 180a may contact the first pad pattern 182c to make an electric contact with the first wiring line 182a. In addition, an upper contact plug 174 and an upper conductive line 176 making an electric connection with the first wiring line 182a may be provided.

In FIG. 10B, second contact plugs 180b contacting the second pad region 134b may be provided. The second contact plug 180b may contact the second pad pattern 182d to make an electric connection with the second wiring line 182b. In addition, an upper contact plug 174 and an upper conductive line 176 making an electric connection with the second wiring line 182b may be provided.

The upper contact plug 174 and the upper conductive line 176 may be wirings for an electric connection again of the first and second wiring lines 182a and 182b, respectively contacting the pad region in the same level stepped layers. The upper contact plugs 174 may preferably make a respective contact with the first and second pad pattern 182c and 182d portions having relatively wide upper surface areas. The upper conductive line 176 may contact the upper contact plug 174, while having a line shape extended in the second direction.

Figure 11:
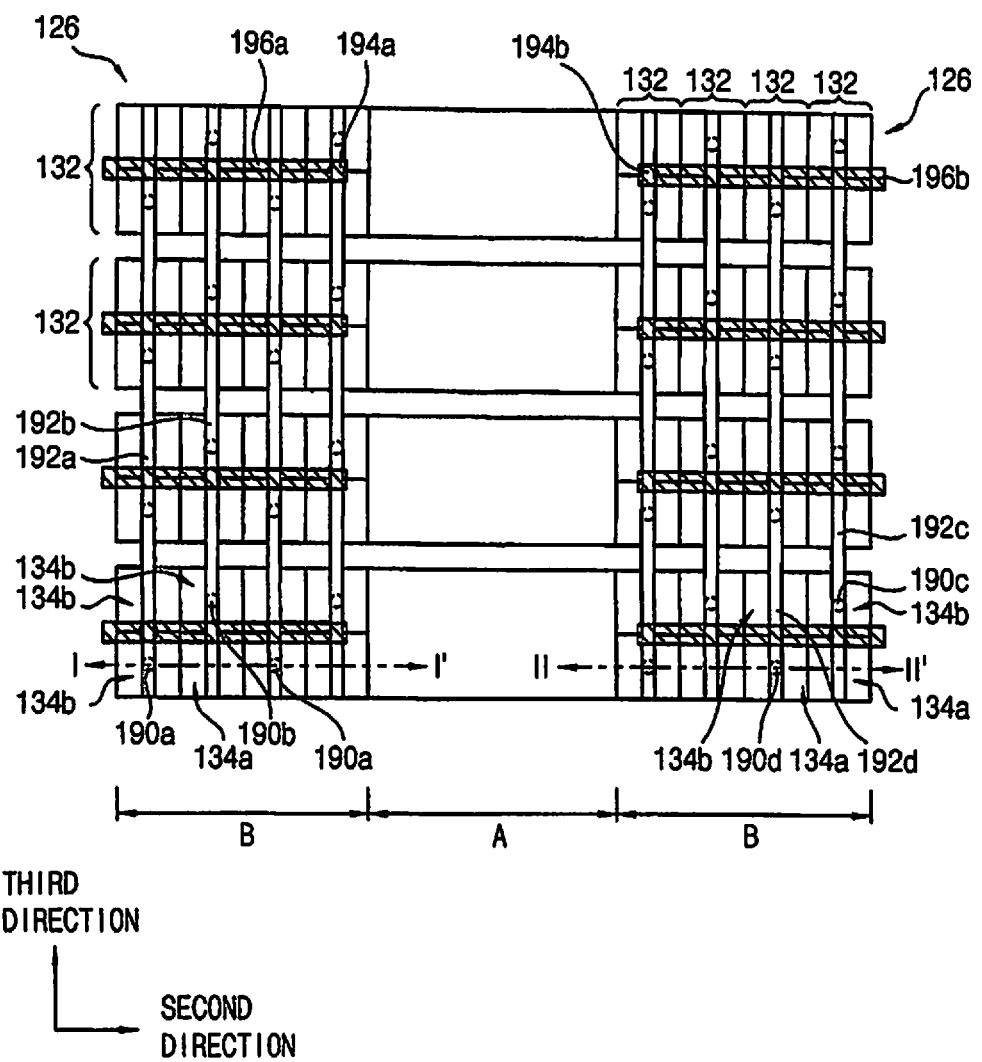
Figure 12A:
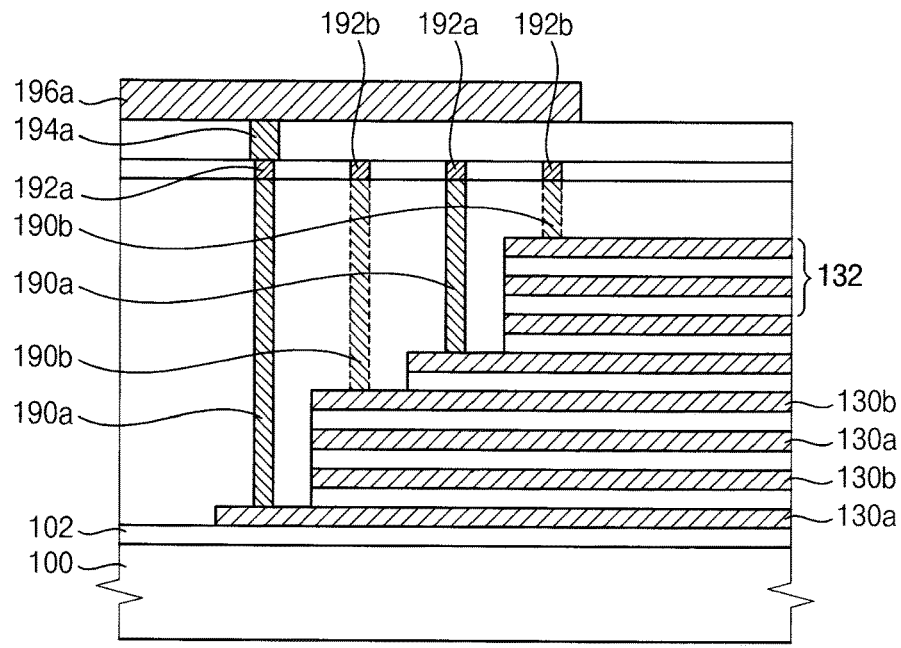
FIGS. 12A and 12B are cross-sectional views illustrated for explaining a wiring structure of a vertical type semiconductor device in accordance with the still further example embodiment.
Figure 12B:
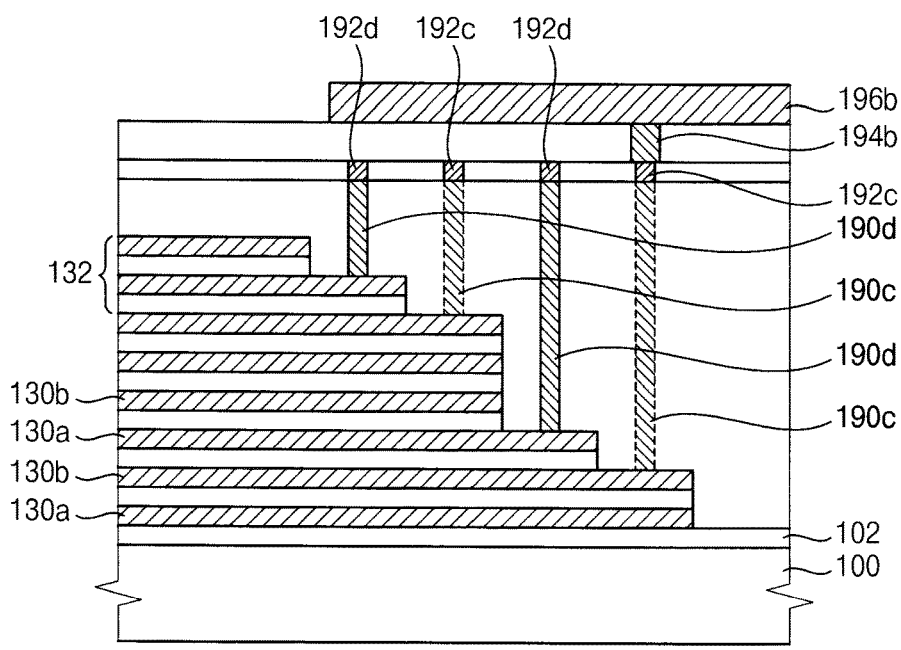

FIG. 11 is a plan view illustrated for explaining a wiring structure of a vertical type semiconductor device in accordance with a still further example embodiment. FIGS. 12A and 12B are cross-sectional views illustrated for explaining a wiring structure of a vertical type semiconductor device in accordance with the still example embodiment.

FIG. 12A is a cross-sectional view taken along I-I' in FIG. 11. FIG. 12B is a cross-sectional view taken along II-II' in FIG. 11.

As illustrated in the plan view in FIG. 11, the step shape pad structures may be symmetrically provided at both sides of the cell region. In example embodiments, the wiring structures may be provided at both sides of the step shape pad structure. As described above, when the wiring structure is formed at both sides, a horizontal area for forming the wiring may be increased and the wiring structures may be easily formed.

Hereinafter, in one stepped layer, the contact plugs contacting the first pad region may be called as first contact plugs 190a and 190c, and the contact plugs contacting the second pad region may be called as second contact plugs 190b and 190d.

Referring to FIGS. 11 and 12A, the step shape pad structure positioned at the left portion will be explained first. At the left step shape pad structure, the contact plugs may be formed only in one pad region among the two pad regions 134a and 134b included in one stepped layer 132. In addition, the contact plugs contacting different pad regions according to the stepped layers may be alternately provided.

In example embodiments, as illustrated in the drawings, the first contact plug 190a contacting the first pad region 134a may be provided in the first stepped layer which is the lowest stepped layer. In the next second stepped layer, the second contact plug 190b contacting the second pad region 134b may be provided. In the next third stepped layer, the first contact plug 190a contacting the first pad region 134a may be provided again. That is, the first and second contact plugs 190a and 190b may be alternately disposed by the stepped layers. The first and second contact plugs 190a and 190b may be positioned at the center portion of the first and second pad regions 134a and 134b.

As described above, in the step shape pad structure positioned at the left side, an electric wiring may be provided with respect to the half of the pad region included in the stepped layer.

On the first contact plugs 190a positioned at the same level stepped layers, the first wiring line 192a may be provided. That is, the first contact plugs 190a positioned at the same level stepped layers may make an electric connection with each other by the first wiring line 192a. The first wiring line 192a may have an extending shape in the third direction.

In addition, the second wiring line 192b may be provided on the second contact plugs 190b positioned at the same level stepped layer. That is, the second contact plugs 190b positioned at the same level stepped layer may be electrically connected with each other by the second wiring line 192b. The second wiring line 192b may have an extending shape in the third direction.

The first and second wiring lines 192a and 192b may be alternately disposed.

An upper wiring for connecting the first and second wiring lines 192a and 192b, respectively contacting the pad region in the same layer may be provided. The upper wiring may include a first upper contact plug 194a and a first upper conductive line 196a. The first upper conductive line 196a may be extended in the second direction. The first upper conductive line 196a making a connection of the layers to each other may be arranged in parallel with a distance from each other.

Referring to FIGS. 11 and 12B, the step shape pad structure positioned at the right side will be explained. At the step shape pad structure positioned at the right side, each of the wirings may be provided at the pad region portion in which the wirings may not be formed at the step shape pad structure positioned at the left side.

In example embodiments, as illustrated in the drawings, a third contact plug 190c contacting the second pad region 134b may be provided at the first stepped layer which is the lowest stepped layer. At the next second stepped layer, a fourth contact plug 190d contacting the first pad region 134a may be provided. At the next third stepped layer, the third contact plug 190c contacting the second pad region 134b again may be provided. That is, the third and fourth contact plugs 190c and 190d may be alternately disposed by the stepped layers. The third and fourth contact plugs 190c and 190d may be positioned at the center portion of the first and second pad regions 134a and 134b.

As described above, at the step shape pad structure positioned at the right side, electric wirings may be provided with respect to the half of the pad regions included in the stepped layer.

On the third contact plugs 190c positioned at the same level stepped layers, the third wiring line 192c may be provided. The third contact plugs 190c positioned at the same level stepped layers may be electrically connected with each other by the third wiring line 192c. The third wiring line 192c may have an extending shape in the third direction.

In addition, on the fourth contact plugs 190d positioned at the same level stepped layer, the fourth wiring line 192d may be provided. That is, the fourth contact plugs 190d positioned at the same level stepped layer may be electrically connected by the fourth wiring line 192d. The fourth wiring line 192d may have an extending shape in the third direction.

The third and fourth wiring lines 192c and 192d may be alternately disposed.

An upper wiring for connecting the third and fourth wiring lines 192c and 192d again, respectively contacting the pad region at the same level stepped layers may be provided. The upper wiring may include second upper contact plugs 194b and second upper conductive lines 196b.

The second upper conductive lines 196b may be extended in the second direction. The second upper conductive lines 196b may be arranged in parallel with a distance.

Figure 13:
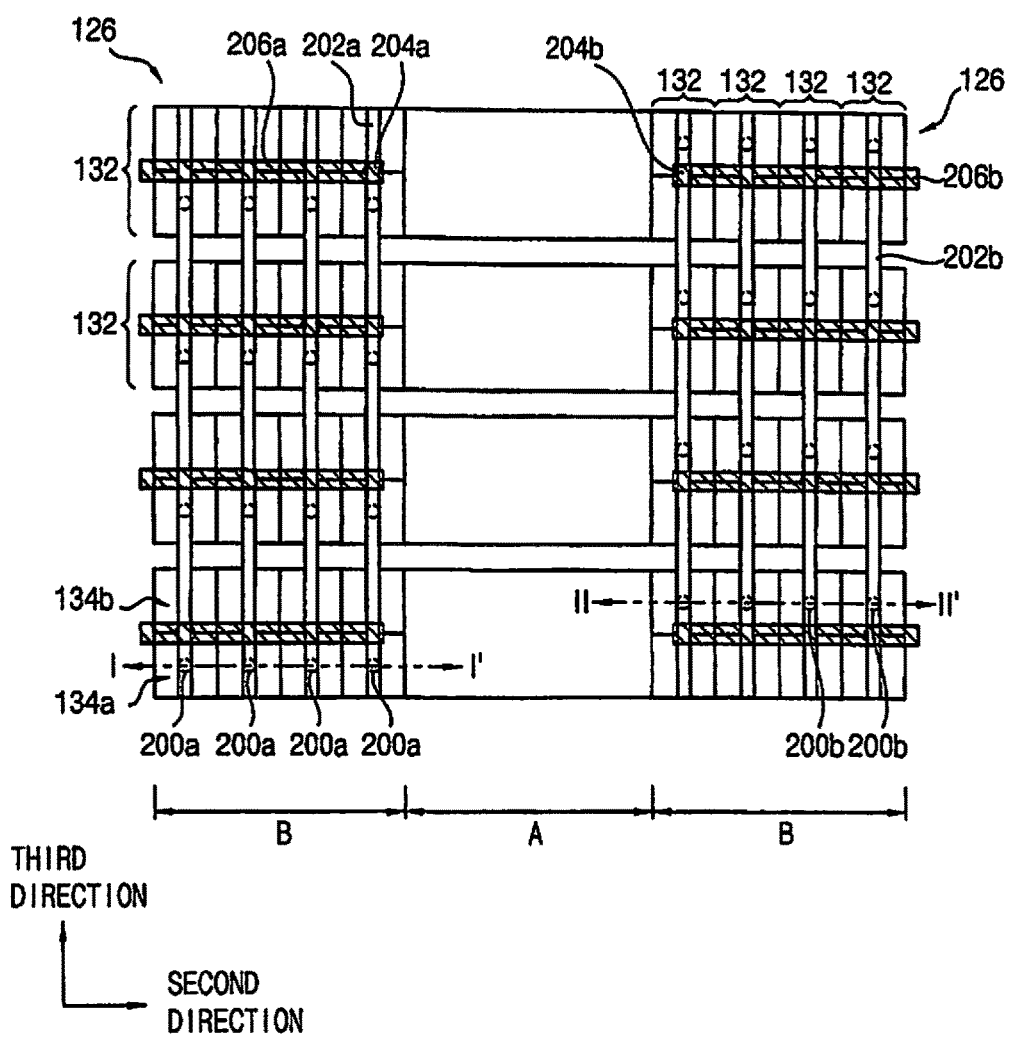
Figure 14A:
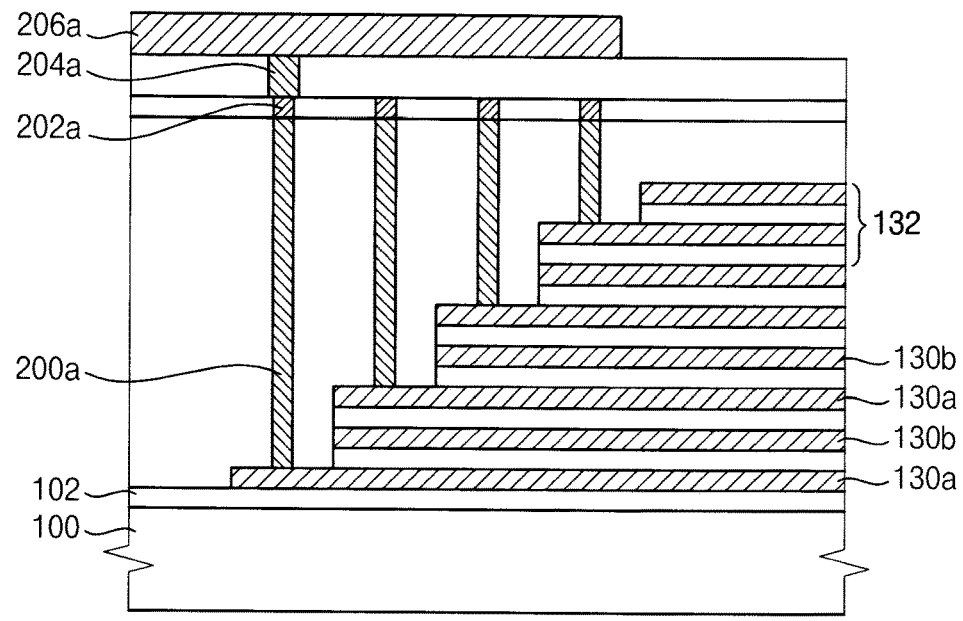
FIGS. 14A and 14B are cross-sectional views illustrated for explaining a wiring structure of a vertical type semiconductor device in accordance with the yet another example embodiment.
Figure 14B:
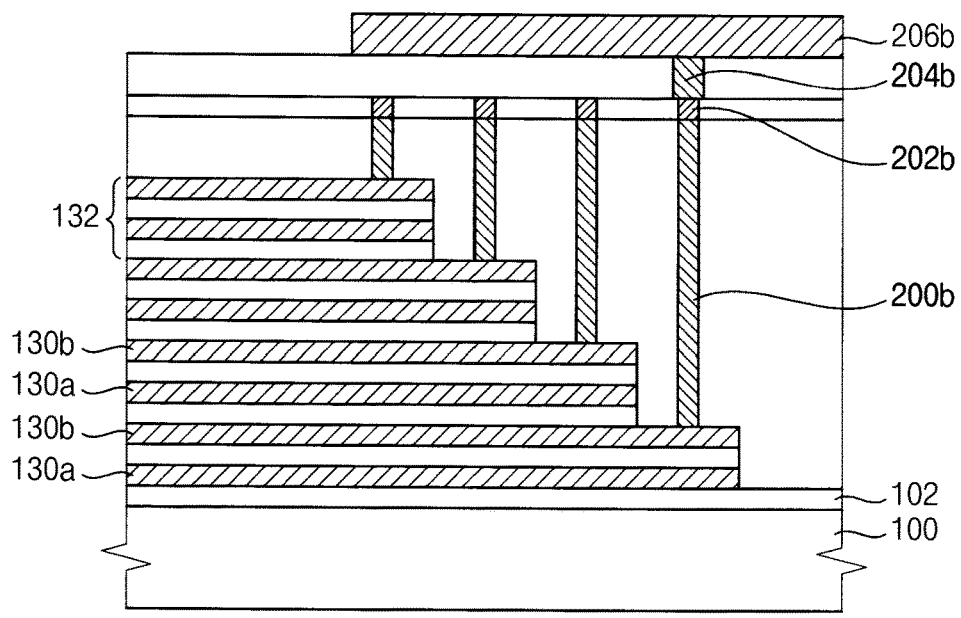

FIG. 13 is a plan view illustrated for explaining a wiring structure of a vertical type semiconductor device in accordance with yet another example embodiment. FIGS. 14A and 14B are cross-sectional views illustrated for explaining a wiring structure of a vertical type semiconductor device in accordance with the yet another example embodiment.

FIG. 14A is a cross-sectional view taken along I-I' in FIG. 13. FIG. 14B is a cross-sectional view taken along II-II' in FIG. 13.

As illustrated in the plan view of FIG. 13, the step shape pad structures may be symmetrically provided at both sides of the cell region. In example embodiments, each of the wiring structures may be provided at both sides of the step shape pad structure.

Hereinafter, the contact plug contacting the first pad region in one stepped layer may be called as a first contact plug, and the contact plug contacting the second pad region may be called as a second contact plug.

Referring to FIGS. 13 and 14A, the step shape pad structure positioned at the left side will be explained first. At the step shape pad structure positioned at the left side, the contact plugs may be formed in only one pad region among two pad regions included in one stepped layer. In addition, the contact plugs making a contact with one pad region by the stepped layers may be provided.

In example embodiments, as illustrated in the drawings, the first contact plugs 200a contacting the first pad region 134a may be provided in all of the stepped layers. That is, the first contact plugs 200a may be arranged in parallel at the stepped layers. The first contact plugs 200a may be positioned at the center portion of the first pad regions.

As described above, electric wirings may be provided with respect to the half of the pad region included in the stepped layer.

A first wiring line 202a for connecting the first contact plugs 200a positioned at the same level stepped layers may be provided. The first wiring line 202a may have an extending shape in the third direction. Because only the first contact plugs 200a may be provided at the stepped layers formed at the left side, only the first wiring lines 202a may be arranged in parallel.

An upper wiring for connecting the first wiring lines 202a again, respectively contacting the first pad region at the same level layer may be provided. The upper wiring may include first upper contact plugs 204a and first upper conductive lines 206a. The first upper conductive lines 206a may be extended in the second direction.

Referring to FIGS. 13 and 14B, the step shape pad structure positioned at the right side will be explained. In the step shape pad structure positioned at the right side, each of the wirings may be provided in the pad region portion in which the wiring may not be formed in the step shape pad structure positioned at the left side.

In example embodiments, as illustrated in the drawings, the second contact plugs 200b contacting the second pad region 134b may be provided at all of the stepped layers. That is, the second contact plugs 200b may be arranged in parallel at the stepped layers. The second contact plugs 200b may be positioned at the center portion of the second pad region 134b.

As described above, electric wirings may be provided with respect to the remaining half of the pad region included in the stepped layer in the step shape pad structure positioned at the right side.

The second wiring line 202b connecting the second contact plugs 200b positioned at the same level stepped layers may be provided. The second wiring line 202b may have an extended shape in the third direction. Because only the second contact plugs 200b may be provided at the stepped layer formed at the right side, only the second wiring lines 202b may be arranged in parallel.

An upper wiring for connecting again the second wiring lines 202b, respectively contacting the pad region at the same level layers may be provided. The upper wiring may include second upper contact plugs 204b and second upper conductive lines 206b. The second upper conductive lines 206b may be extended in the second direction.

Hereinafter, a method of forming the above-described step shape pad structure will be explained.

FIGS. 15 to 22 are perspective views illustrated for explaining a method of forming a step shape pad structure of the vertical type semiconductor device illustrated in FIG. 1.

Referring to FIG. 15, a semiconductor substrate 100 including a cell forming region A for forming memory cells and a wiring forming region B may be prepared. The semiconductor substrate 100 may be a single crystalline silicon substrate.

A pad insulating layer 102 may be formed on the semiconductor substrate 100. On the pad insulating layer 102, sacrificial layers 104 and first insulating layers 106 may be alternately formed one by one. The first insulating layer 106 may be formed by depositing silicon oxide. The sacrificial layer 104 may be formed by using a material having an etching selectivity with respect to the first insulating layer 106. In example embodiments, the sacrificial layer 104 may include silicon nitride.

The stacking number of the sacrificial layers 104 may be the same as the stacking number of cell transistors and selection transistors. Thus, the stacking number of the sacrificial layers 104 may be changed according to the stacking number of the transistors. Even though the sacrificial layers 104 having 6 layers are illustrated in the drawing, the stacking number of the first insulating layers 106 and the sacrificial layers 104 may not be limited to the number.

Referring to FIGS. 16 and 17, the first insulating layers 106 and the sacrificial layers 104 may be partially etched to form a first preliminary step shape structure 110 (see FIG. 17) having a step shape at the edge portion thereof. The first preliminary step shape structure 110 may include each of the stepped layers 110a to 110d, and at least two sacrificial layers 104 may be included in each of the stepped layers 110a to 110d. In addition, the first insulating layer 106 may be inserted between the sacrificial layers 104.

As illustrated in the drawings, the uppermost layer included in each of the stepped layers 110a to 110d of the first preliminary step shape structure 110 may be the first insulating layer 106. Alternatively, the uppermost layer included in each of the stepped layers 110a to 110d of the first preliminary step shape structure 110 may be the sacrificial layer 104.

In example embodiments, two sacrificial layers 104 and two of first insulating layers 106 may be included in each of the stepped layers of the first preliminary step shape structure 110. Thus, as illustrated in the drawings, stepped layers of four floors 110a to 110d may be formed. Hereinafter, the stepped layers will be called as first to fourth stepped layers 110a to 110d for the explanation.

The first preliminary step shape structure 110 may be illustrated to be formed only at one side, however, may be formed at four side portions of the edge portions.

Hereinafter, an example embodiment on a method of forming the first preliminary step shape structure will be explained.

Referring to FIG. 16, a first photoresist layer may be formed on the uppermost first insulating layer 106, and a first photolithography process may be performed with respect to the first photoresist layer to form a first photoresist pattern (not illustrated). The first photoresist pattern may be provided as a mask for forming the lowest stepped layer. Thus, the first photoresist pattern may have a shape exposing the upper portion for forming the lowest first stepped layer 110a. By using the first photoresist pattern, an etching process may be performed to remove two sacrificial layers 104. In this case, the first insulating layers 106 between the sacrificial layers 104 may be removed at the same time.

Then, a first trimming process for partially removing the side portion of the first photoresist pattern may be performed to form the second photoresist pattern 112. The second photoresist pattern may have a shape exposing the upper portion of a portion for forming the first and second stepped layers 110a and 110b. By using the second photoresist pattern 112, an etching process may be performed to remove two sacrificial layers from each of the exposed layers. In this case, the first insulating layers 106 between the sacrificial layers 104 may be removed at the same time.

Through performing the above-described processes, an unfinished step shape structure 108 as illustrated in FIG. 16 may be formed.

Referring to FIG. 17, a second trimming process may be performed to form a third photoresist pattern (not illustrated), and etching process may be performed by using the third photoresist pattern as an etching mask to remove the two sacrificial layers 104 and the first insulating layers 106 between the sacrificial layers 104. Through performing the processes, a first preliminary step shape structure 110 as illustrated in FIG. 17 may be formed. Then, the photoresist pattern 112 may be removed.

In the above example embodiment, the first preliminary step shape structure 110 may be formed by performing the trimming processes and the etching processes two times. When the number of stacking the sacrificial layers 104 and the first insulating layers 110 increases, the trimming process and the etching process may be repeatedly performed to form the first preliminary step shape structure.

As described above, a series of processes including the photoresist pattern forming process, the trimming process and the etching process may be performed to form one stepped layer. Thus, the number of the processes may increase according to the increase of the number of the stepped layers. However, in example embodiments, because two sacrificial layers 104 may be included in one stepped layer stepped layer 110a to 110d, the number of the stepped layers included in the first preliminary step shape structure 110 may be largely decreased.

In a common step shape structure, one sacrificial layer may be included in one stepped layer. When comparing with the common structure, the first preliminary step shape structure 110 in accordance with the example embodiment may include half of the stepped layers. As described above, the number of the processes necessary for forming the first preliminary step shape structure may be largely decreased, and the first preliminary step shape structure 110 may be easily formed.

Referring to FIG. 18, an etching mask pattern 114 selectively covering the corresponding portion of the second pad region may be formed in the first preliminary step shape structure 110. The etching mask pattern 114 may include a photoresist pattern.

As illustrated in the drawings, when an etching mask pattern 114 partially covering one side portion of the first preliminary step shape structure 110 is formed, the structure having the step shape as illustrated in FIG. 1 may be formed through performing subsequent processes.

However, different step shape structures from the structure illustrated in FIG. 1 may be formed by changing the exposed portion of the etching mask pattern 114. Particularly, the step shape structures having the shapes illustrated in FIG. 3 may be formed when the exposed portion has a hole shape.

Referring to FIG. 19, by using the etching mask pattern 114 as an etching mask, one first insulating layer 106 and one sacrificial layer 104 from the exposed portion may be etched to form a secondary preliminary step shape structure 116.

In the etching process, only the sacrificial layer 104 positioned at the upper portion of each of the stepped layers 110a to 110d of the first preliminary step shape structure 110 may be etched. Thus, a portion of the lower sacrificial layer 104 may be exposed by the etched portions in the second preliminary step shape structure 116. Hereinafter, the etched portion will be called as a dent portion 118.

That is, two the sacrificial layers 104 may be included in each step of the stepped layers 116a to 116d in the second preliminary step shape structure 116. However, at least a portion of the upper surface of the two sacrificial layers 104 may have no overlapped portion in the first direction.

Figure 20:
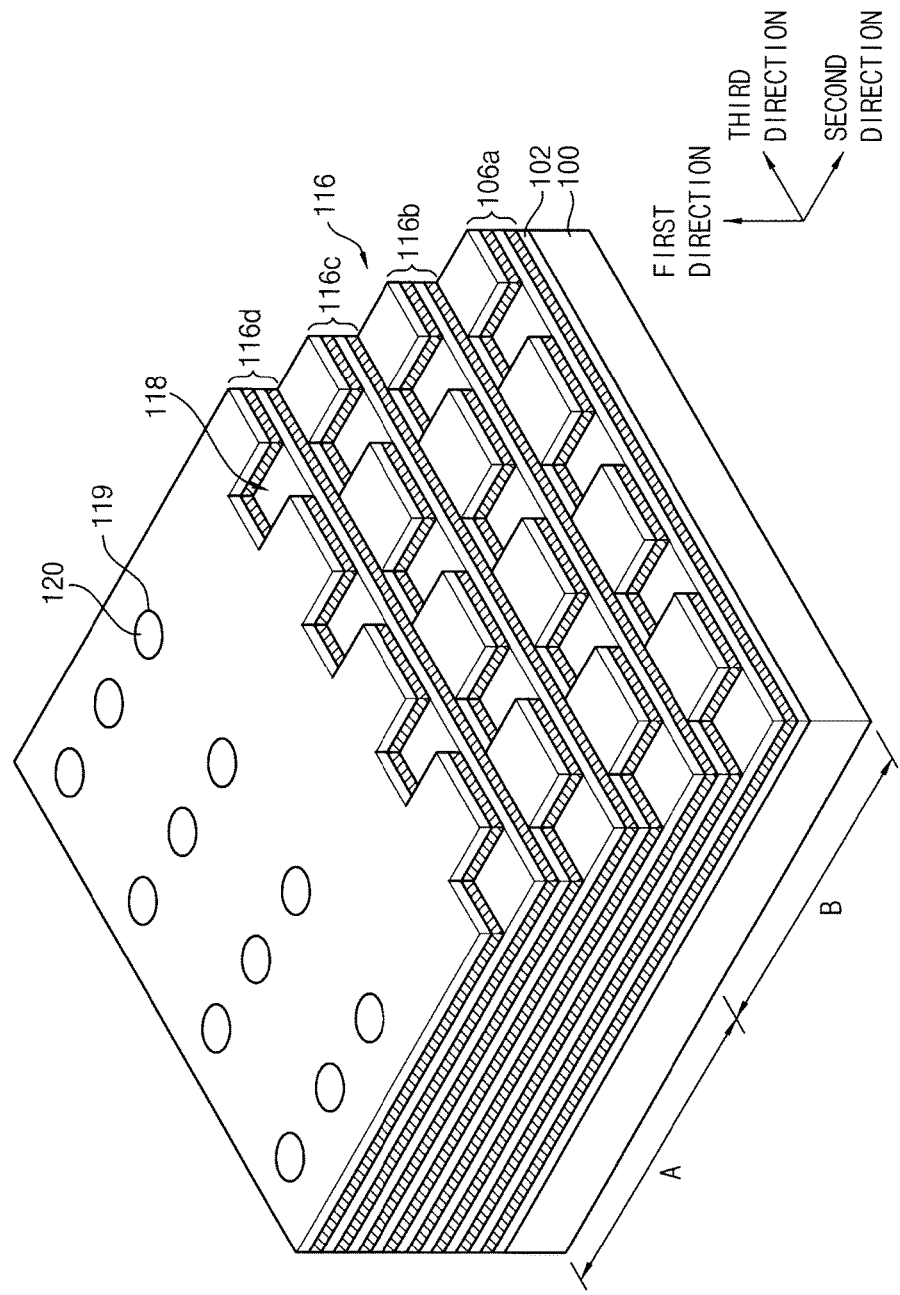

Referring to FIG. 20, a first insulating interlayer (not illustrated) covering the second preliminary step shape structure 116 may be formed.

Then, a pillar structure 120 contacting the substrate through the second preliminary step shape structure 116 may be formed. The pillar structure 120 may include a channel pattern and may be designed in various shapes. Particularly, the pillar structure may be formed only as the channel patterns. Alternatively, the pillar structure may include the channel pattern, and may include at least one layer among a tunnel insulating layer, a charge storing layer and a blocking layer on the channel pattern. Thus, the pillar structure 120 may not be limited to a specific structure.

Hereinafter, an example embodiment for forming the pillar structure may be explained in brief.

A plurality of channel holes 119 exposing the upper surface of the substrate 100 through the first upper insulating interlayer, the first insulating layer 106, the sacrificial layers 104 and the pad insulating layer may be formed. The channel holes 119 may be arranged in a row along the second and third directions and may be formed.

In the channel holes 119, a first blocking layer (not illustrated), a first charge storing layer (not illustrated), a tunnel insulating layer (not illustrated) and a first channel layer (not illustrated) may be formed one by one. The first blocking layer may be formed by using an oxide compound such as silicon oxide, the first charge storing layer may be formed by using a nitride compound such as silicon nitride, and the tunnel insulating layer may be formed by using an oxide compound such as silicon oxide. The first channel layer may be formed by using doped or undoped polysilicon with impurities or amorphous silicon.

The first channel layer, the tunnel insulating layer, the first charge storing layer and the first blocking layer positioned at the bottom portion of the channel holes 119 may be removed. Through the above-described processes, a first channel layer pattern, a tunnel insulating layer pattern, a first charge storing layer pattern and a first blocking layer pattern may be formed on the side wall of the channel hole.

Then, a second channel layer may be formed on the first channel layer. An insulating layer filling up the inner portion of the channel hole 119 may be formed on the second channel layer and then, planarized. Through the planarization process, a channel pattern and an insulating pattern of stacked structure of the first channel layer and the second channel layer may be respectively formed. The upper portion of the insulating pattern may be partially removed to form a recess portion, and a conductive material may be formed to form a conductive pattern.

Through performing the above-described processes, the pillar structure 120 having the channel pattern of a macaroni shape may be formed.

Figure 21:
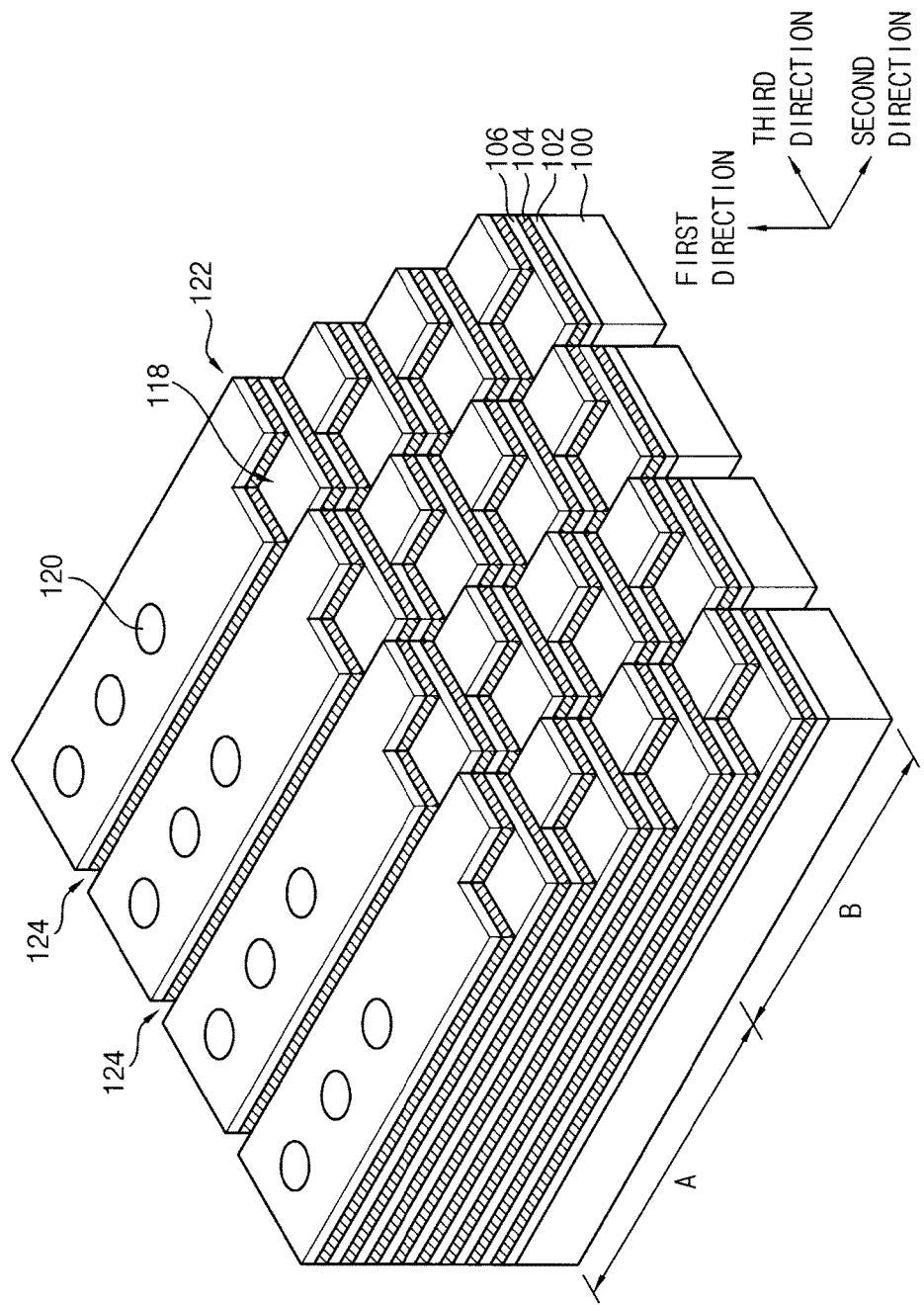

Referring to FIG. 21, the second preliminary step shape structure 116 may be partially etched to form opening portions 124 extended in the second direction and exposing the substrate. Through forming the opening portions 124, the second preliminary step shape structures 116 may be cut to form a third preliminary step shape structures 122 having an extended line shape in the second direction.

According to the position of forming the opening portions 124, the shape of the third preliminary step shape structure 122 may be changed.

When the forming position of the opening portion 124 includes a portion of the edge portion of the dent portion 118, the third preliminary step shape structure 122 having the shape as illustrated in FIG. 21 may be formed. That is, the dent portion 118 included in the third preliminary step shape structure 122 may have an opened shape at two edge portions.

Alternatively, when the opening portion 124 is spaced apart from the edge portion of the dent portion 118, the third preliminary step shape structure having the shape as illustrated in FIG. 2 may be formed. In this case, the dent portion of the third preliminary step shape structure 122 may have an opened shape at one edge portion.

Referring to FIGS. 22 and 1, the sacrificial layers 104 may be replaced with word lines through a gate replacement process to form the step shape pad structure 126. Hereinafter, the gate replacement process will be explained.

The sacrificial layers 104 exposed to the side wall of the opening portion 124 may be removed to form gaps (not illustrated). Through the gap, the side wall of the pillar structure may be exposed.

On the exposed surface of the pillar structures 120 in the gaps, a second blocking layer (not illustrated) may be formed. A barrier metal layer (not illustrated) may be formed on the second blocking layer. In exemplary embodiments, the second blocking layer may be formed by using a metal oxide, for example, aluminum oxide, hafnium oxide, lanthanum oxide, lanthanum aluminum oxide, lanthanum hafnium oxide, hafnium aluminum oxide, titanium oxide, tantalum oxide, zirconium oxide, etc. However, the second blocking layer may not be formed on the surface of the gaps.

The side wall of the pillar structure may have a stacked structure constituting memory cells. Thus, the layer formed on the surface of the gap may be different according to the thin films included in the pillar structure.

A metal layer (not shown) may be formed on the barrier metal layer to completely fill up the gap portions.

The barrier metal layer (not shown) may be formed by using, for example, titanium, titanium nitride, tantalum, tantalum nitride, etc. These compounds may be used alone or by stacking two or more. The barrier metal layer may be formed along the surface profile of the gaps. The gaps may not be completely filled up with the barrier metal layer.

The metal layer may comprise a metal having a low electric resistance. Examples of the metal used for metal layer 130 may include tungsten.

The metal layer may be partially removed so as to remain the metal layer only in the gaps. That is, the metal layer formed in the opening portion 124 may be removed. The removing process may include a wet etching process.

Through performing the removing process, the portion in which the sacrificial layer 104 had been formed may be replaced with a conductive layer patterns (e.g. word lines 130a and 130b) each including a barrier metal layer pattern and a metal pattern as illustrated in FIGS. 22 and 1. The conductive layer pattern (e.g., the word lines 130a and 130b1 may be provided as the gates of a cell transistor and a selection transistor according to the position thereof. In addition, each of the gates may have a connected shaped in the second direction, and may serve as a word line. The edge portion of the one stepped layer 132 may have a step shape, and the upper surface thereof may be provided as a pad region. Two of first and second word lines 130a and 130b may be included in the one stepped layer 132, and first and second pad regions 134a and 134b may be respectively included in the first and second word lines 130a and 130b.

In example embodiments, the sacrificial layers may be replaced with the word lines through a gate replacement process.

Alternatively, the sacrificial layers 104 may be formed by using a conductive material such as polysilicon. In this case, the forming process of the opening portion 124 in FIG. 21, the removal of the sacrificial layer and the replacement process of the metal layer in FIG. 22 may not be performed. Thus, the formed structure in FIG. 20 may be a completed step shape pad structure.

According to the above-explained processes, the step shape pad structure of the vertical type semiconductor device in FIG. 1 may be completely formed.

Figure 23:
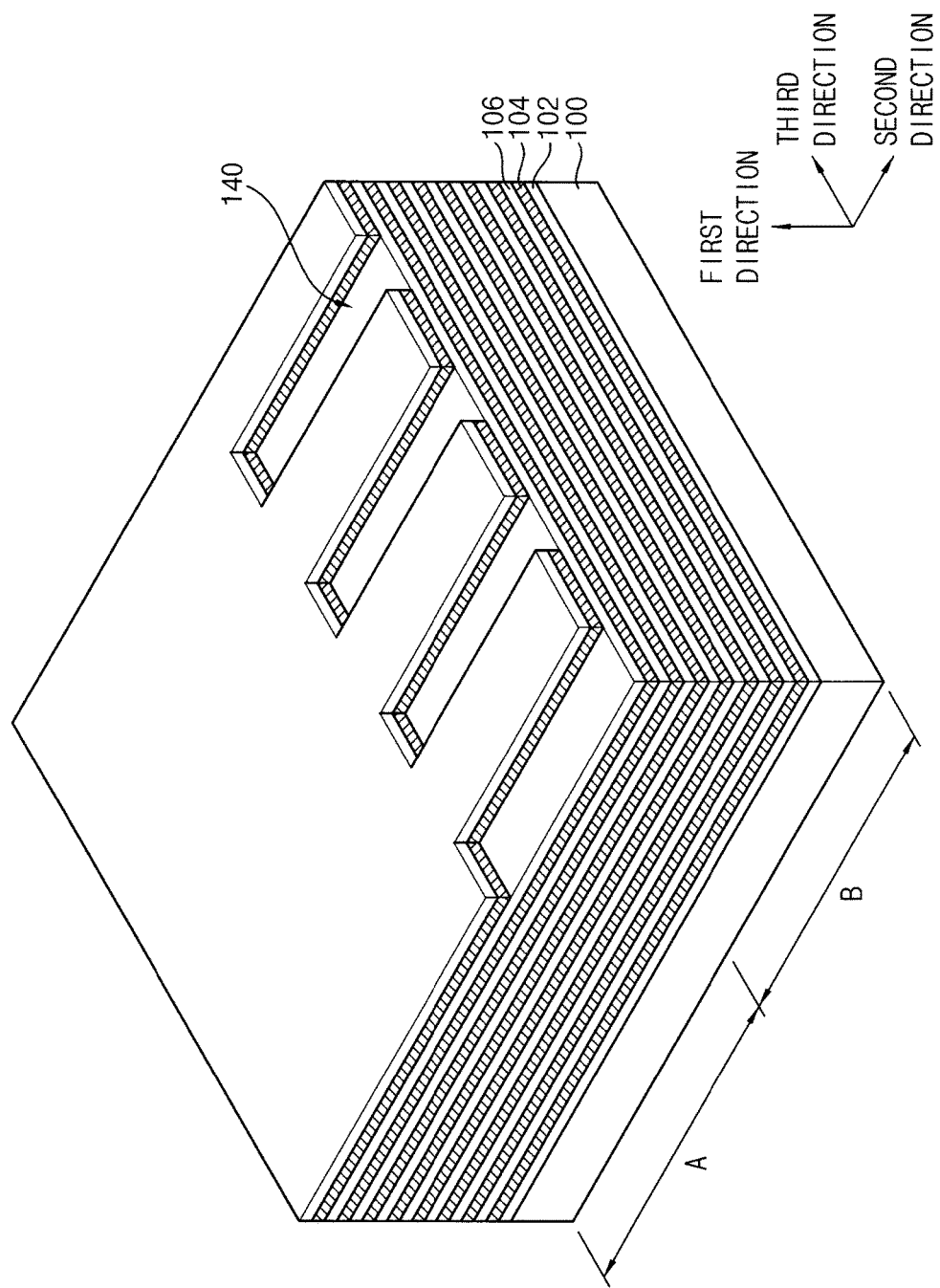
Figure 24:
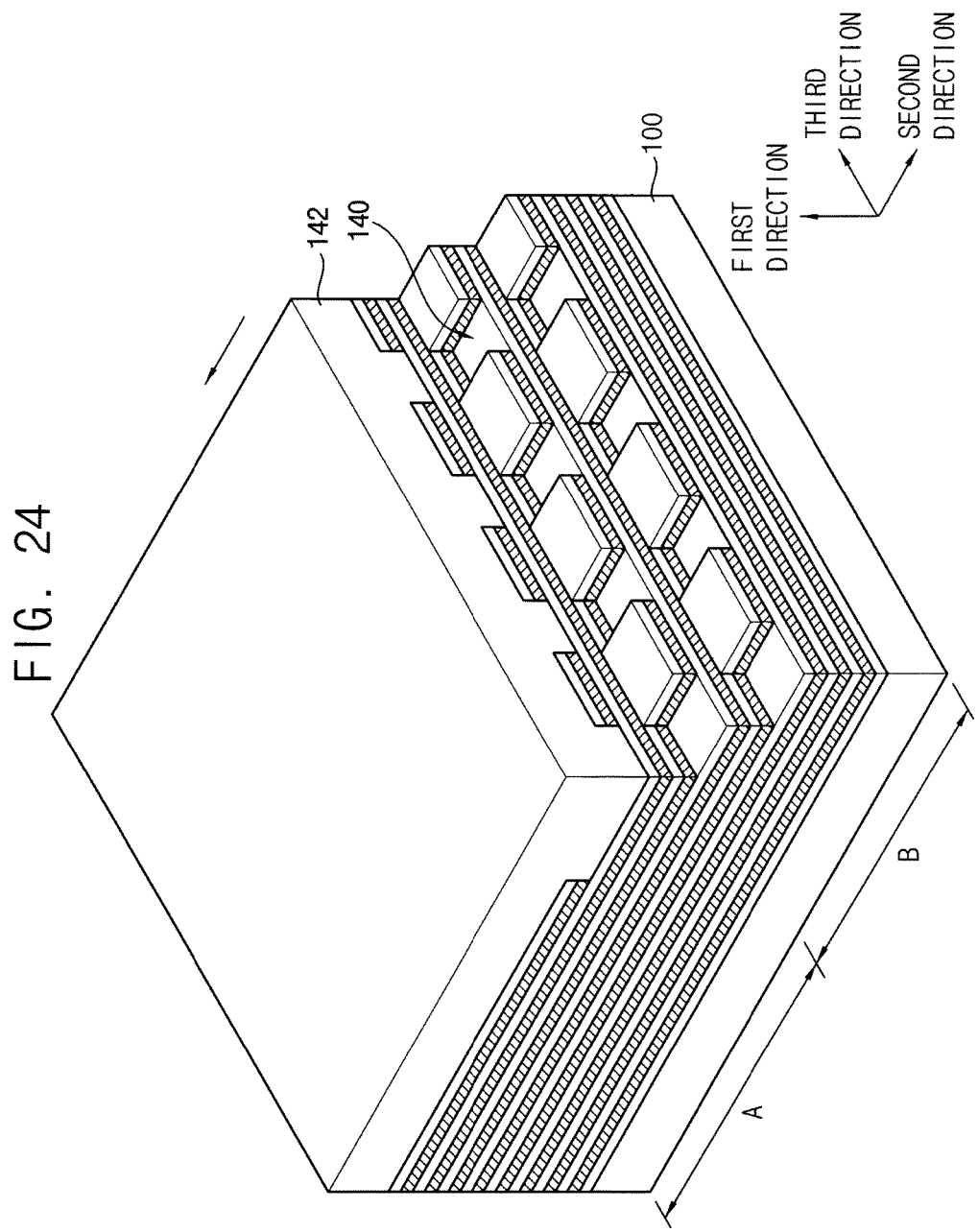

FIGS. 23 and 24 are perspective views illustrated for explaining other methods for forming a step shape pad structure of the vertical type semiconductor device in FIG. 1.

First, the process explained referring to FIG. 15 may be performed to form the structure illustrated in FIG. 15.

Referring to FIG. 23, the uppermost first insulating layer 106 and the sacrificial layer 104 positioned in the connecting wiring region B may be partially etched. In this case, only the uppermost one layer of the first insulating layers 106 and the uppermost one layer of the sacrificial layers 104 may be etched. A step may be formed between the upper surfaces of the etched portion and the unetched portion. The lowered portion of the upper surface formed through the etching may be called as a step portion 140. In this case, only the uppermost one layer of the first insulating layers 106 and the uppermost one layer of the sacrificial layers 104 may be etched. The step portion 140 may be a portion facing the first pad region in each of the stepped layers.

Referring to FIGS. 24 and 17, the first insulating layers 106 and the sacrificial layers 104 in the structure including the step portion 140 may be partially etched to form a preliminary step shape structure 116 having a step shape at the edge portion. The preliminary step shape structure 116 formed by the above process may have the same shape as the second preliminary step shape structure 116 illustrated in FIG. 19.

Hereinafter, an example embodiment of forming the preliminary step shape structure will be described.

Referring to FIG. 24, a first photoresist layer may be formed on a structure including the step portion 140, and a first photolithography process may be performed with respect to the first photoresist layer to form a first photoresist pattern (not illustrated). The first photoresist pattern may be provided as a mask for forming the lowest stepped layer. Thus, the first photoresist pattern may have a shape exposing the upper portion of a portion for forming the lowest first stepped layer. By using the first photoresist pattern, two sacrificial layers and two first insulating interlayers may be etched.

Then, a first trimming process for partially removing the side portion of the first photoresist pattern may be performed to form a second photoresist pattern 142. The second photoresist pattern may have a shape exposing the upper portion of a portion for forming the first and second stepped layers. By using the second photoresist pattern 142, the sacrificial layers and the first insulating layers, the sacrificial layers and the first insulating layers of two floors from each of the exposed upper surface, may be etched to remove. Through performing the above-described processes, the step portion 140 may be included in one stepped layer, and the step portion 140 may be lower portion in the one layer when compared with other portions.

Referring to FIG. 19 again, the trimming process and the removing process of the sacrificial layers and the first insulating layers in two layers may be repeatedly performed to form the preliminary step shape structure. That is, through performing the second trimming process, a third photoresist pattern may be formed, and the sacrificial layers and the first insulating layers of two floors from each of the exposed upper surface may be etched by using the third photoresist pattern as an etching mask. Through repeatedly performing the above processes so as to form the lowest one layer of the stepped layers, the preliminary step shape structure may be formed. Then, the third photoresist pattern may be removed.

Through performing the above process, the same structure as illustrated in FIG. 19 may be formed. As described above, the step portion 140 may be formed in the stacked structure in advance, and then, the etching process may be performed to form the preliminary step shape structure 116 including the dent portion 118 in the one step layer. Thus, the preliminary step shape structure 116 may be formed through simplified processes.

Then, the same process may be performed as the processes explained referring to FIGS. 20 to 22. The step shape pad structure of the vertical type semiconductor device illustrated in FIG. 1 may be formed.

Figure 25:
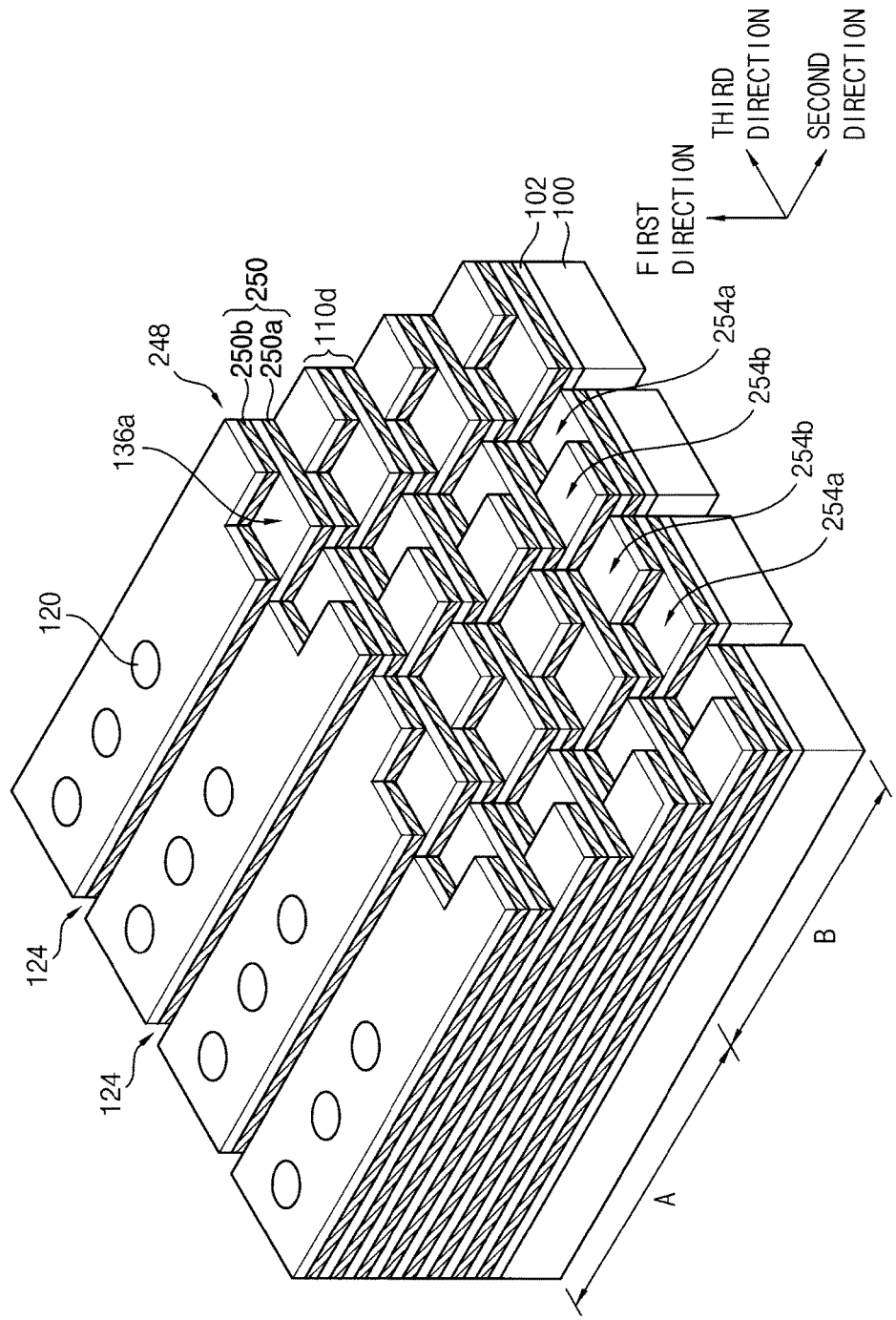

FIG. 25 is a perspective view illustrated for explaining a step shape pad structure of a vertical type semiconductor device in accordance with an example embodiment.

The step shape pad structure in FIG. 25 may be the same as the step shape pad structure in FIG. 1 except for the position of the dent portion of the word line in each row. Thus, the overlapping portions with the explanation referring to FIG. 1 will be omitted.

Referring to FIG. 25, at least two word lines 250a and 250b may be stacked vertically at one stepped layer in the pad structure. In example embodiments, two word lines may be stacked at one stepped layer. The word line positioned at the lower portion of the one stepped layer may be called as the first word line 250a and the word line positioned at the upper portion may be called as the second word line 250b.

The second word line 250b positioned at the upper portion of one stepped layer may include a dent portion 136a formed by partially etching the end portion thereof, and may include an unetched portion having a shape extruding from a side. The dent portion 136a may have an opened shape at two edge portions. Thus, one of the second word lines 250b may include one extruding portion.

However, the first word line 250a may not include an extruding portion at the end portion thereof and may have an extending shape to the extruding portion of the second word line 250b. Thus, through the dent portion 136a of the second word line 250b, a portion of the upper surface of the first word line 250a may not be shielded by the second word line 250b.

The extruding portion of the second word line 250b may be provided as the second pad region 254b. In addition, the exposed portion by the dent portion 136a in the first word line 250a may be provided as the first pad region 254a. The first and second pad regions 254a and 254b may be required to have sufficient upper areas so as to make contacts with the contact plugs for subsequent wiring.

As illustrated in the drawing, the pad structures 248 may be separated to each other and may be disposed in parallel to each other. In the neighboring pad structures 248, the dent portions 136a formed at the second word lines may have a symmetric shape with respect to an imaginary line between the pad structures 248 extended in the second direction. Thus, the neighboring pad structures 248 may not have the same shape. That is, each of the dent portions 136a included in the adjacently disposed second word lines 250b may be disposed in face.

When observing the pad regions positioned at the same stepped layer in the third direction in the pad structure 248, two of the first pad regions 254a and two of the second pad regions 254b may be alternately disposed. That is, the same pad regions may be adjacently disposed in the third direction.

Figure 26:
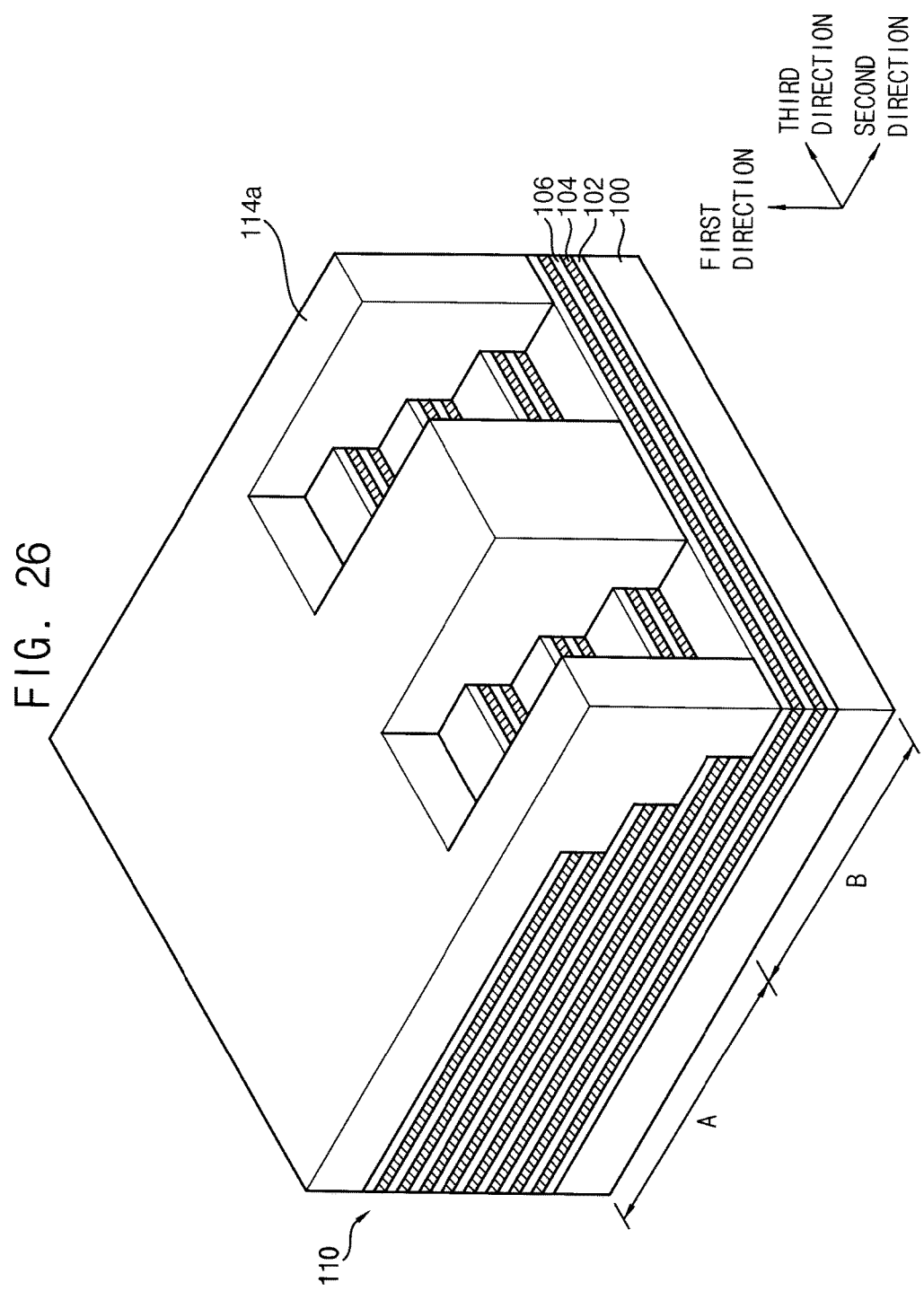
Figure 27:
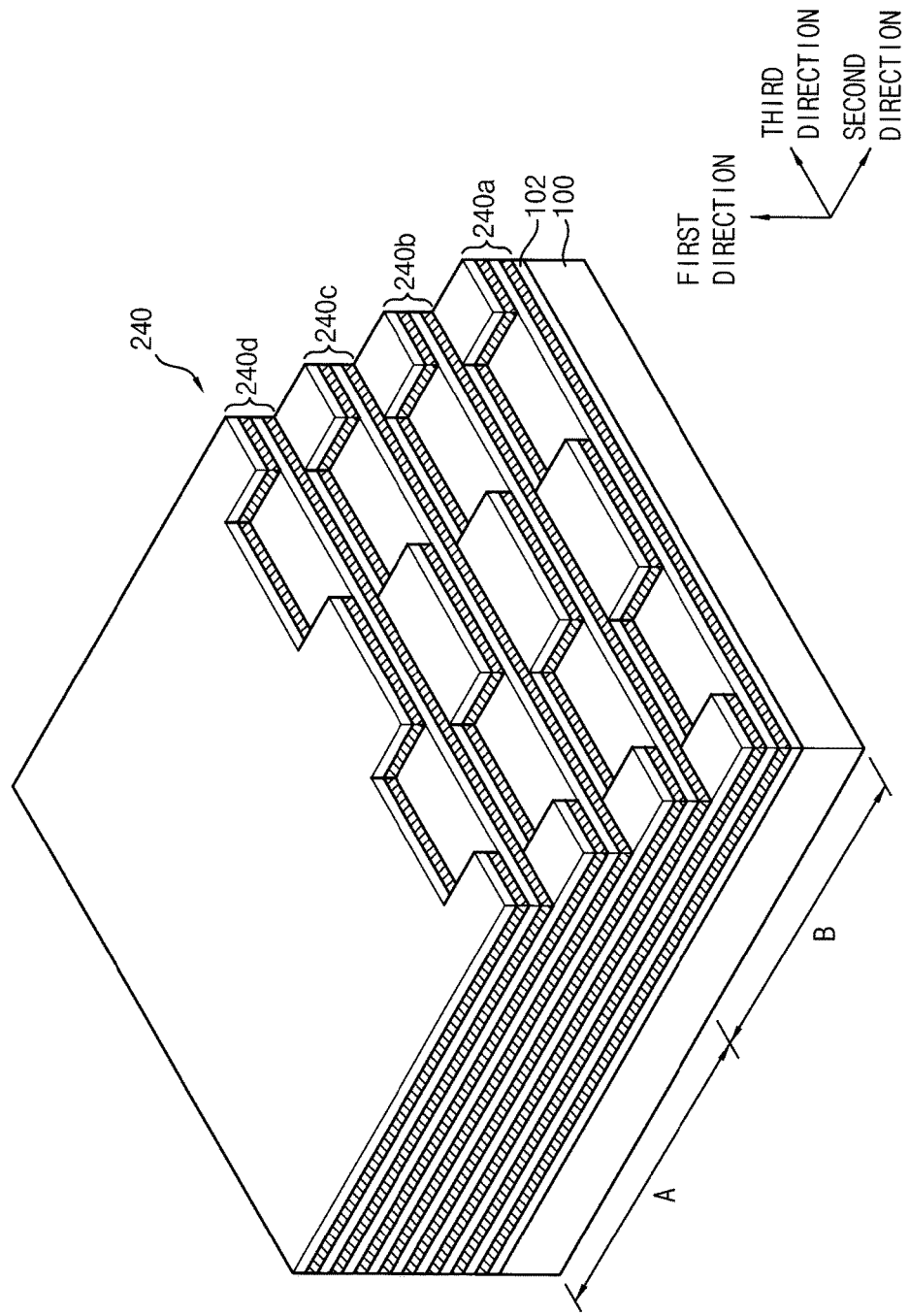

FIGS. 26 and 27 are perspective views illustrated for explaining a method of forming the step shape pad structure of the vertical type semiconductor device in FIG. 25.

The step shape pad structure of the vertical type semiconductor device illustrated in FIG. 25 may be formed by performing similar forming method of the step shape pad structure of the vertical type semiconductor device illustrated in FIG. 1. Thus, explanation on repeated portions may be omitted.

First, the processes explained referring to FIGS. 15 to 17 may be performed to form the first preliminary step shape structure 110 illustrated in FIG. 17.

Referring to FIG. 26, an etching mask pattern 114a selectively covering a portion corresponding to the second pad region in the first preliminary step shape structure 110 may be formed. That is, the etching mask pattern 114a may expose the first pad region portion. The etching mask pattern 114a may include a photoresist pattern.

In example embodiments, the first pad region of the adjacent preliminary step shape pad structure may face in the third direction. Thus, the width of the exposed portion of the etching mask pattern 114a may be the same as the added width of the first pad region of the two neighboring step shape pad structures.

Referring to FIG. 27, the sacrificial layer and the first insulating layer in one layer in the exposed portion may be respectively etched by using the etching mask pattern 114a as an etching mask to form a second preliminary step shape structure 240.

In the etching process, only the sacrificial layer 104 positioned at the upper portion in each of the stepped layers 240a to 240d included in the second preliminary step shape structure 240 may be etched. Thus, the second preliminary step shape structure 240 may not be overlapped with the underlying sacrificial layer at the etched portion 242.

Then, through performing the same processes described referring to FIGS. 20 to 22, the step shape pad structure of the vertical type semiconductor device illustrated in FIG. 25 may be formed.

Figure 28:
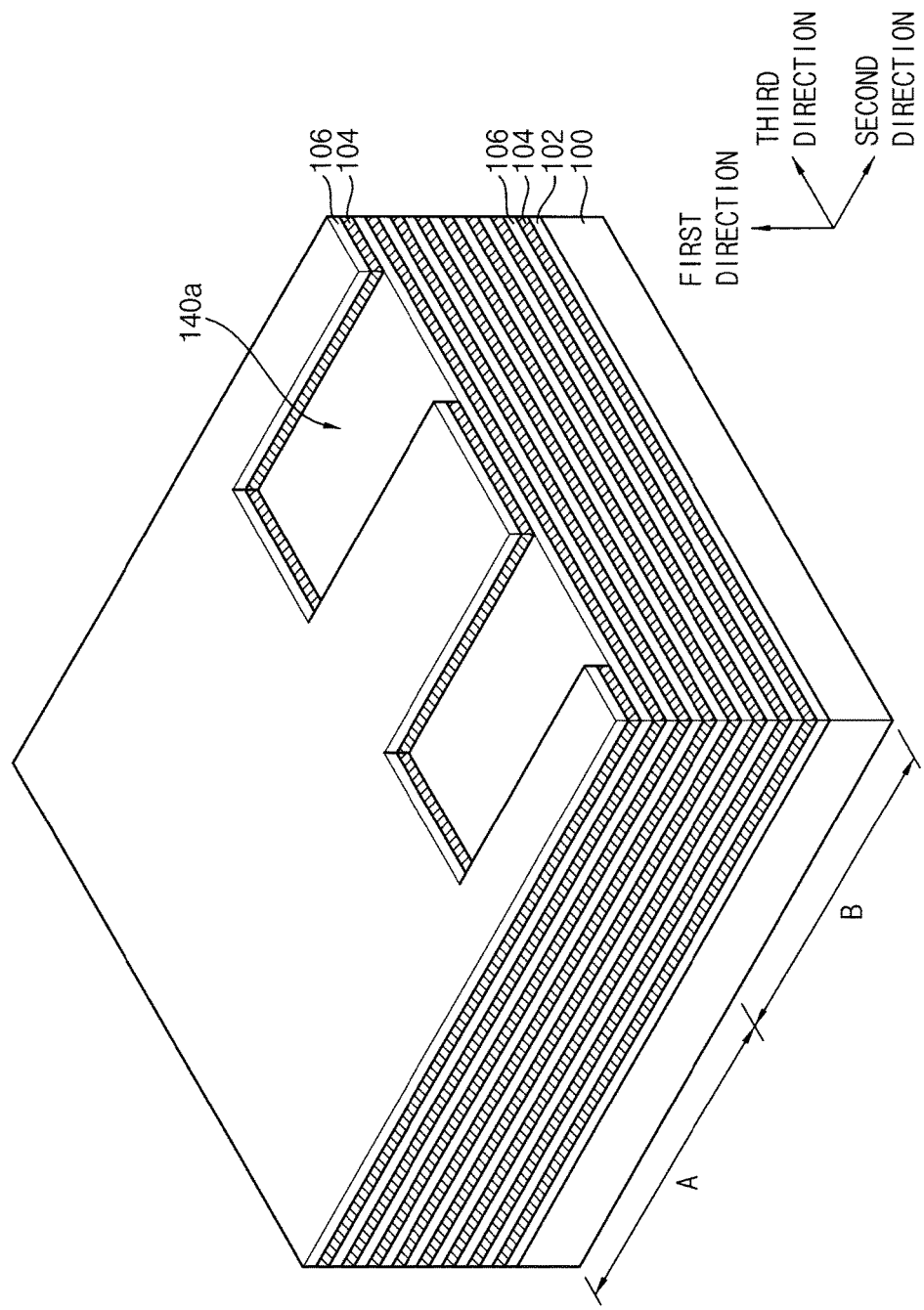
Figure 29:
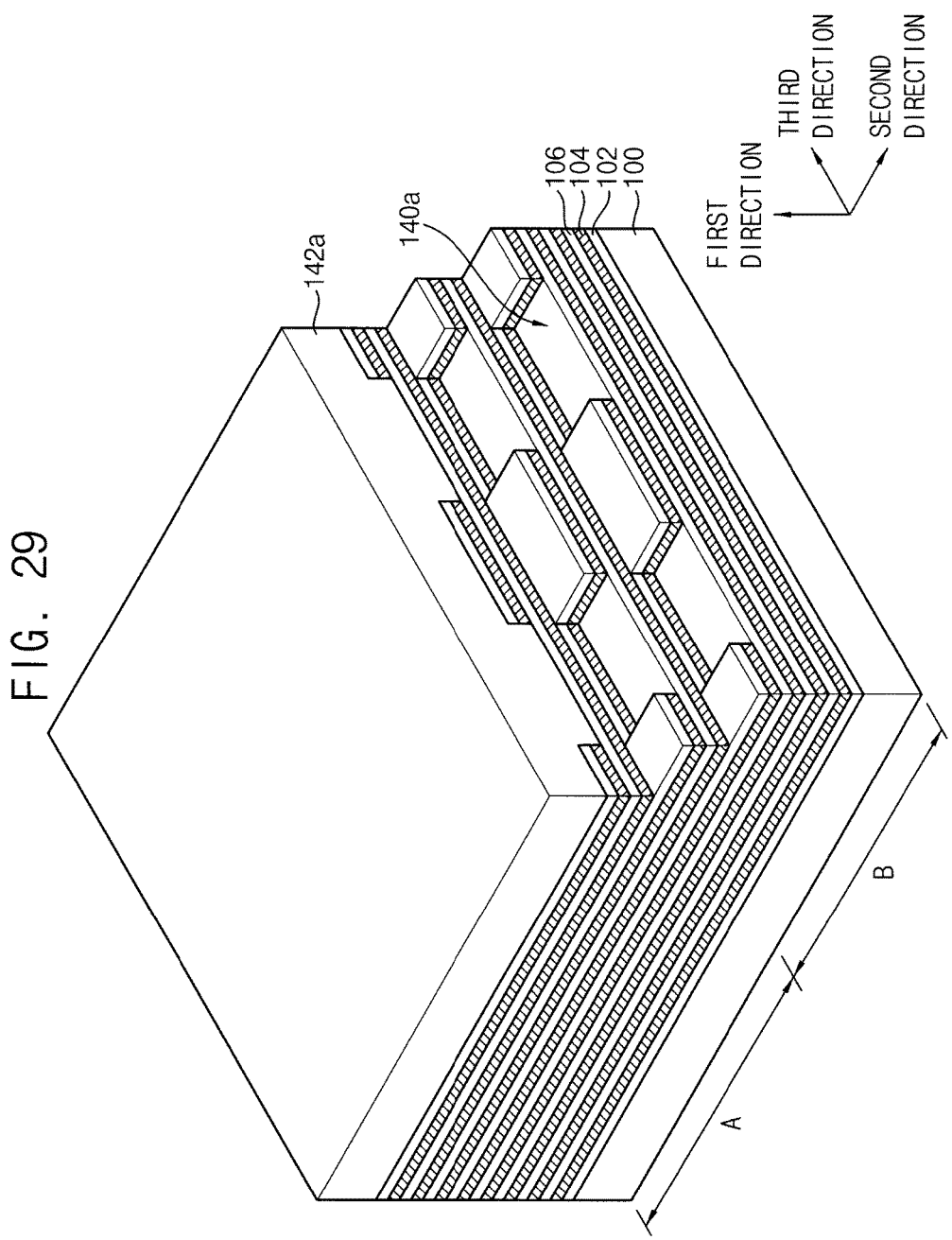

FIGS. 28 and 29 are perspective views illustrated for explaining other methods of forming a step shape pad structure of the vertical type semiconductor device illustrated in FIG. 25.

First, through performing the processes explained referring to FIG. 15, the structure illustrated in FIG. 15 may be formed.

Referring to FIG. 28, the connecting wiring region B in the uppermost first insulating layer 106 and the sacrificial layer 104 may be partially etched to form the step portion 140a. The step portion 140a may be a lowered portion of the upper surface by the etching. In this case, the uppermost one first insulating layer 106 and one sacrificial layer 104 may be etched. The step portion 140a may be a portion facing the first pad region at each of the stepped layers. In the neighboring step shape pad structures, the first pad regions may be faced in the third direction.

Referring to FIGS. 29 and 27, the first insulating layers 106 and the sacrificial layers 104 in the structure including the step portion 140a may be partially etched to form a preliminary step shape structure 240 having a step shape at the edge portion thereof.

Hereinafter, an example embodiment of a method of forming the preliminary step shape structure will be described.

Referring to FIG. 29, a first photoresist layer may be formed on the structure including the step portion, and a first photolithography process may be performed with respect to the first photoresist layer to form a first photoresist pattern (not illustrated). The first photoresist pattern may be provided as a mask for forming the lowest stepped layer. The sacrificial layers 104 and the first insulating layers 106 of two floors from each of the exposed upper surface may be etched by using the first photoresist pattern.

Then, a first trimming process for partially removing the first photoresist pattern may be performed to form a second photoresist pattern 142a. The second photoresist pattern 142a may have a shape exposing the upper portion of a portion for forming the first and second stepped layers. The sacrificial layers 104 and the first insulating layers 106 may be etched to remove by using the second photoresist pattern 142a as an etching mask.

Through performing the above processes, a portion including the step portion 140a may be lower by one layer than the portion excluding the step portion.

Referring to FIG. 27 again, the trimming process and the removing process of the two sacrificial layers may be repeatedly performed. Through repeating the above processes so as to form a lowest stepped layer, the preliminary step shape structure 240 may be formed. Then, the fourth photoresist pattern may be removed.

The same processes explained referring to FIGS. 20 and 22 may be performed. Referring to FIG. 20, the preliminary step shape structures 240 may be cut to form the opening portions 124, and the opening portions 124 may be formed to have a line shape passing the center portion of the step portion 140a. Through performing the above processes, the step shape pad structure of the vertical type semiconductor device in FIG. 25 may be formed.

Subsequent wiring forming processes may be performed with respect to the step shape pad structure in example embodiments. The wirings formed at the step shape pad structure may be one of the illustrated wirings in FIGS. 6, 9, 11 and 13.

Hereinafter, a method of forming the wiring structure illustrated in FIGS. 5 to 7B in the step shape pad structure formed by the above method will be explained in brief.

Figure 30:
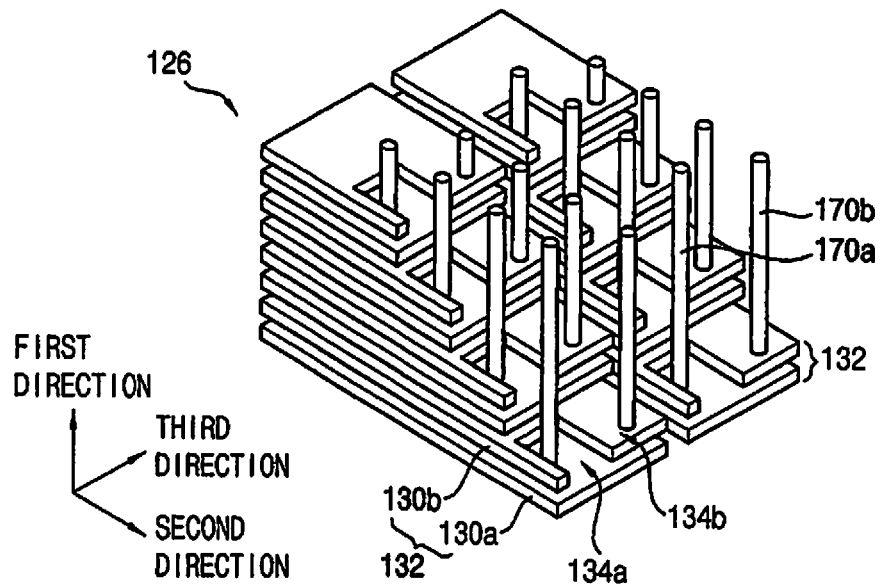
Figure 31:
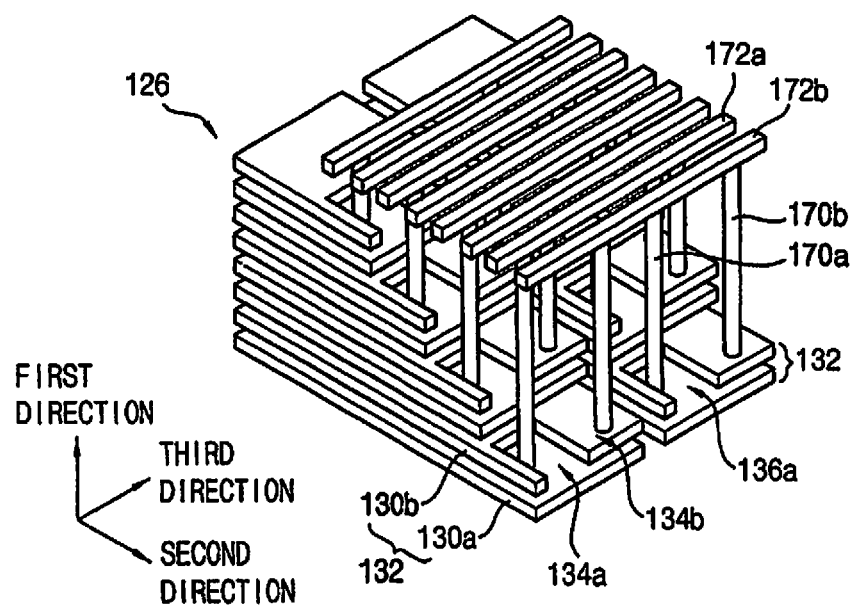

FIGS. 30 and 31 are perspective views illustrated for explaining a method of forming the wiring structure illustrated in FIGS. 5 to 7B.

Referring to FIG. 30, an insulating pattern (not illustrated) may be formed in the opening portion 124 between the step shape pad structures. In addition, an upper insulating interlayer (not illustrated) covering the step shape pad structure and the insulating pattern may be formed.

The upper insulating interlayer may be partially etched to form first and second contact holes respectively exposing the first pad region and the second pad region of the word line. The first and second contact holes positioned at the same step shape may not be disposed in parallel in the third direction but may be disposed in a zigzag shape.

Then, the first and second contact holes may be filled up with a conductive material to form first and second contact plugs 170a and 170b.

Referring to FIG. 31, first and second wiring lines 172a and 172b may be respectively formed on the first and second contact plugs 170a and 170b. The first and second wiring lines 172a and 172b may be formed by depositing a conductive layer and then patterning the conductive layer.

Alternatively, the first and second wiring lines 172a and 172b may be formed by a damascene method. Through performing the above processes, the structure as illustrated in FIG. 6 may be formed.

Referring to FIG. 5 again, an insulating interlayer covering the first and second wiring lines 172a and 172b may be formed. An upper contact hole penetrating the insulating interlayer may be formed. The upper contact holes may expose the upper surfaces of each of the first and second wiring lines 172a and 172b contacting the pad region in the same level stepped layers.

Then, the upper contact holes may be filled up with a conductive material to form upper contact plugs 174. In addition, an upper conductive line 176 may be formed on the upper contact plugs 174. The upper conductive line 176 may have a line shape extended in the second direction.

Through performing the above explained processes, the wiring structure illustrated in FIGS. 5 to 7B may be formed.

Meanwhile, in the above-described processes, the wiring structure illustrated in FIGS. 8 and 9, the wiring structure illustrated in FIG. 11 and the wiring structure illustrated in FIG. 13 may be respectively formed by changing the forming position of the contact plug and the position of the wiring.

Hereinafter, example embodiments on step shape pad structures having various shapes will be explained.

Figure 32A:
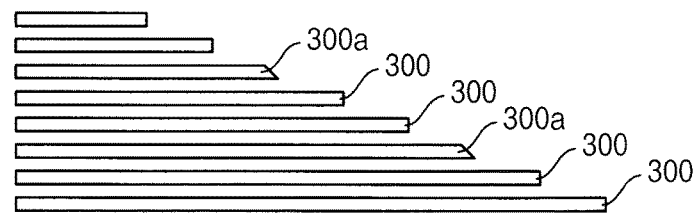
FIG. 32A is a cross-sectional view illustrated for explaining a step shape pad structure of the vertical type semiconductor device in accordance with another example embodiment.
Figure 32B:
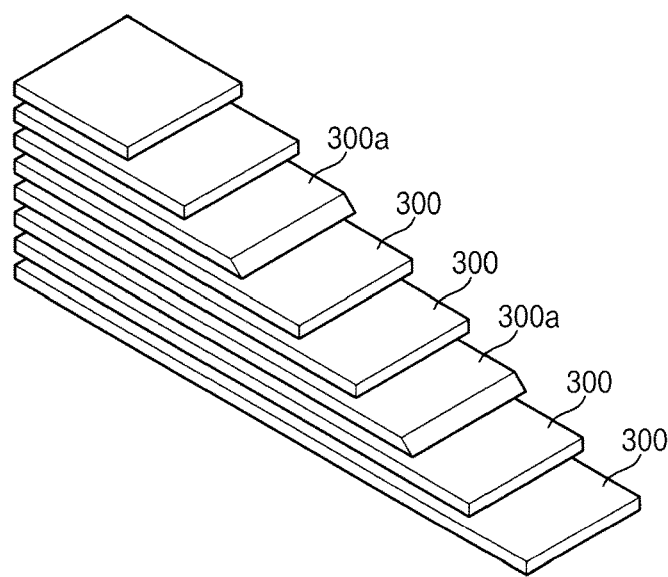
FIG. 32B is a perspective view of a step shape pad structure illustrated in FIG. 32A.

FIG. 32A is a cross-sectional view illustrated for explaining a step shape pad structure of a vertical type semiconductor device in accordance with another example embodiment. FIG. 32B is a perspective view of the step shape pad structure illustrated in FIG. 32A.

Referring to FIGS. 32A and 32B, pad structures which are stacked structures of word lines positioned in a connection region may be provided. The pad structures may have a step shape, and one of the word lines 300 and 300a may be included in each of the stepped layers.

The pad structures may have a step shape, and the edge portions of each of the word lines 300 and 300a may not be overlapped to each other. The upper surface portion of the edge portion of each of the word lines 300 and 300a may be provided as a pad region for forming contact plugs.

As illustrated in the drawings, the side wall of the end portion of at least one word line 300a among each of the word lines 300 and 300a stacked in the vertical direction may have a different shape from other neighboring word lines. The word line 300a having a different end portion of the side wall among the word lines 300 and 300a may be provided to confirm process defects and the stacking number of the word lines. The word line 300a having the different end portion of the side wall may be called as a first word line 300a. In addition, the word lines excluding the first word line 300a may be called as a second word line 300.

The side walls of the end portions of the first and second word lines 300a and 300 may have different slopes. Particularly, the second word line 300 may have a vertical slope. In addition, the first word line 300a may have a gentle slope when compared with the second word line 300.

As described above, owing to the provision of the first word line 300a having the different side wall of the end portion, the confirmation of the process defects and the stacking number of the word lines may be easily performed.

Figure 33:
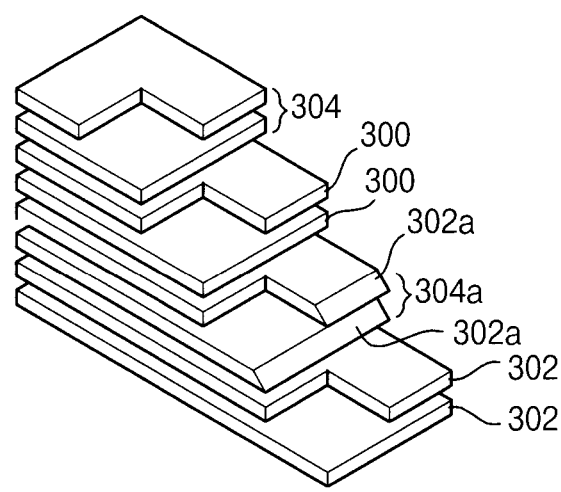

FIG. 33 is a perspective view illustrated for explaining a step shape pad structure of a vertical type semiconductor device in accordance with still another example embodiment.

The step shape pad structure in FIG. 33 may have the similar structure as the step shape pad structure in FIG. 1 except for including the different end portion of the side wall in the stepped layers.

The side wall of the end portion of at least one stepped layer 304a among each of the stepped layers 304 included in the step shape pad structure may have a different shape from other neighboring stepped layers 304. The stepped layer 304a having the different side wall of the end portion among the stepped layers 304 may be provided to confirm process defects and the stacking number of the word lines. The stepped layer 304a having the different side wall of the end portion may be called as a stepped layer 304a for confirming. As illustrated in the drawings, two word lines 302a may be included in the stepped layer 304a for confirming.

The two word lines 302a included in the stepped layer 304a for confirming may have a slope different from other word lines. Particularly, the second word lines 302 in the remaining stepped layer other than the stepped layer 304a for confirming may have a vertical slope. The first word lines 302a in the stepped layer 304a for confirming may have a gentle slope.

As described above, the confirmation of the process defects and the stacking number of the word lines may be easily performed by providing the first word line 302a having the different side wall of the end portion.

Figure 34A:
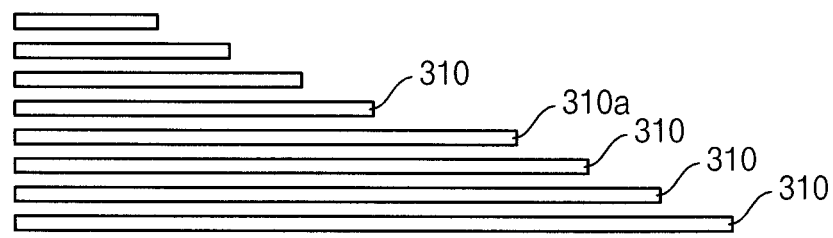
FIG. 34A is a cross-sectional view illustrated for explaining a step shape pad structure of a vertical type semiconductor device in accordance with yet another example embodiment.
Figure 34B:
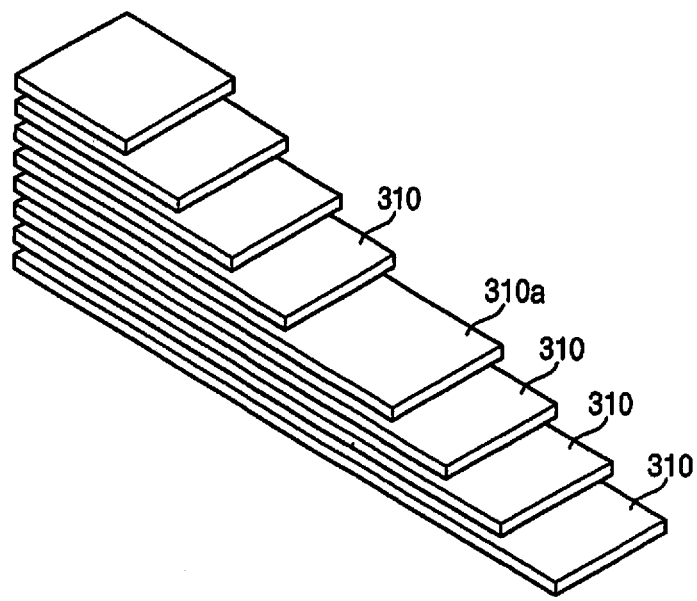
FIG. 34B is a perspective view of the step shape pad structure illustrated in FIG. 34A.

FIG. 34A is a cross-sectional view illustrated for explaining a step shape pad structure of a vertical type semiconductor device in accordance with yet another example embodiment. FIG. 34B is a perspective view of the step shape pad structure illustrated in FIG. 34A.

Referring to FIGS. 34A and 34B, pad structures which may be stacked structures of word lines positioned in a connection region may be provided. The pad structures may have a step shape, and one of the word lines may be included in each of the stepped layers.

Because the pad structures have the step shape, the edge portions of each of the word lines 310 and 310a may not be overlapped to each other. The upper surface portion of the edge portions of each of the word lines 310 and 310a may be provided as a pad region for forming contact plugs.

At least one word line 310a among the word lines 310 and 310a stacked in a vertical direction may have a pad region having a different area from other neighboring word lines 310. That is, at least one among the word lines stacked in the vertical direction may have a first pad region having a first area, and the remaining word lines may have a second pad region having a second area different from the first area. As illustrated above, the first pad region may be provided as a pad region for confirming and may have a wider shape than the second pad region.

The word lines including the first pad region may be called as the first word line 310a. In addition, the word line including the second pad region may be called as the second word line 310.

Through providing the first word line 310a, the confirmation of the process defects and the number of the word lines may be easily performed.

Figure 35:
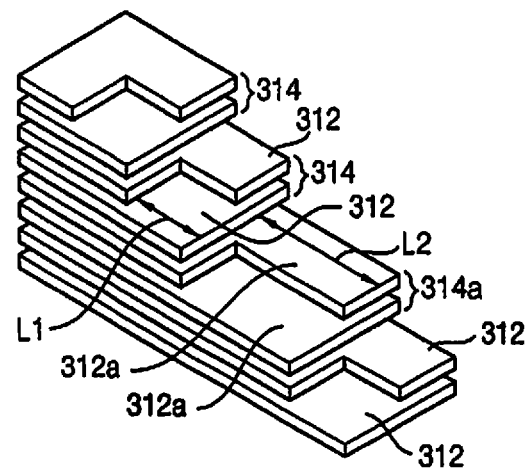

FIG. 35 is a perspective view illustrated for explaining a step shape pad structure of a vertical type semiconductor device in accordance with yet still another example embodiment.

The step shape pad structure in FIG. 35 may have the similar structure as the step shape pad structure illustrated in FIG. 1 except for the area of the pad region.

That is, the area of the upper surface of the pad region included in at least one stepped layer 314a among the stepped layers 314 and 314a included in the step shape pad structure may be different from the area of the upper surface of the pad region included in other neighboring stepped layers 314. The stepped layer 314a having a different area of the upper surface of the pad region may be provided to confirm the process defects and the stacking number of the word lines. The stepped layer having the different area of the upper surface of the pad region may be called as a stepped layer 314a for confirming. As illustrated in the drawings, two word lines 312a may be included in the stepped layer 314a for confirming.

The two word lines 312a included in the stepped layer 314a for confirming may have a different area of the upper surface of the pad region different from other word lines 312. Particularly, two pad regions having a second area may be included in the remaining stepped layers 314 other than the stepped layer 314a for confirming. In the stepped layer 314a for confirming, first pad regions having a first area greater than the second area may be included.

As described above, the confirming of the process defects and the number of the word lines may be easily performed by providing the stepped layer 314a for confirming having the different area of the pad region.

Figure 36:
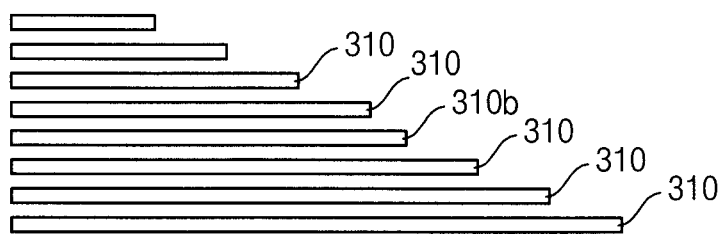

FIG. 36 is a cross-sectional view illustrated for explaining a step shape pad structure of a vertical type semiconductor device in accordance with a still further example embodiment.

Referring to FIG. 36, pad structures which may be stacked structures of word lines positioned in a connection region may be provided. The pad structures may have a step shape, and one of the word lines may be included in each of the stepped layers.

At least one of the first word lines 310b among the word lines stacked in the vertical direction may be differentiated from other neighboring word line, i.e., the second word line 310. That is, the first word lines 310b among the word lines stacked in the vertical direction may have a first pad region having the first area, and the second word lines 310 may have a second pad region having a different area from the first area. The first word lines 310b may be provided as a word line for confirming. As illustrated in the drawings, the first pad region may have a smaller shape than the second pad region in example embodiments.

As described above, the confirmation of the process defects and the stacking number of the word lines may be easily performed by providing the first word line 310b.

Figure 37:
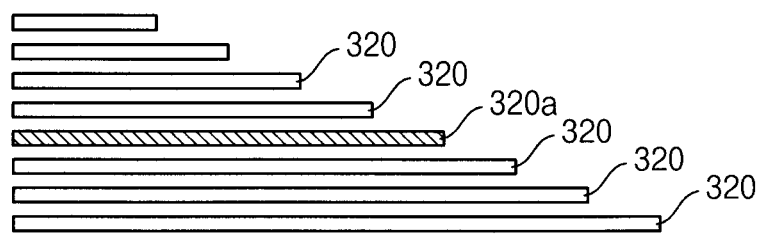

FIG. 37 is a cross-sectional view illustrated for explaining a step shape pad structure of a vertical type semiconductor device in accordance with a yet further example embodiment.

Referring to FIG. 37, pad structures which may be stacked structures of word lines positioned in a connection region may be provided. The pad structures may have a step shape, and one of the word lines may be included in each of the stepped layers.

Because the pad structures may have the step shape, the edge portions of each of the word lines may not be overlapped. The upper surface portion of the edge portion of each of the word lines may be provided as a pad region for forming contact plugs.

As illustrated in the drawings, at least one word line 320a among each of the word lines 320 and 320a stacked in the vertical direction may include a different material from other word lines 320.

That is, the word line including the different material may be called as the first word line 320a, and the first word line 320a may be formed by using a first material. The first word line 320a may be provided as a word line for confirming the process defects of the first word line 320a and the stacking number of the word lines. In addition, the word lines other than the first word line 320a may be called as a second word line 320. The second word line 320 may be formed by using a second material different from the first material.

Through providing the first word line including the first material, the process defects and the stacking number of the word lines may be easily confirmed.

Figure 38:
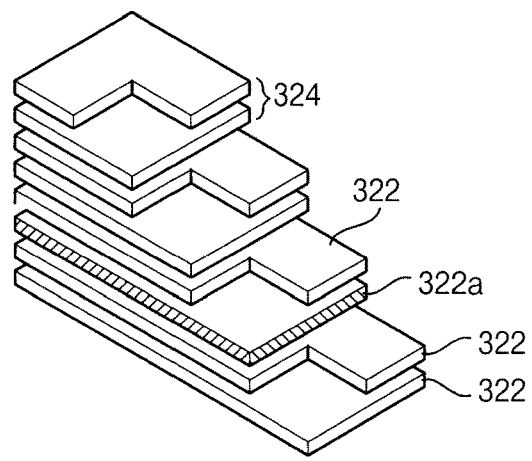

FIG. 38 is a perspective view illustrated for explaining a step shape pad structure of a vertical type semiconductor device in accordance with an additional example embodiment.

The step shape pad structure in FIG. 38 may have the similar structure as the step shape pad structure illustrated in FIG. 1 except for the material included in at least one of the word lines.

Among the word lines 322 and 322a included in the step shape pad structure, at least one word line 322a may include a material different from the other neighboring word lines 322.

Through providing the word line 322a for confirming, formed by using a material different from the other word lines, the confirmation of the process defects and the number of the word lines may be easily performed.

Figure 39:
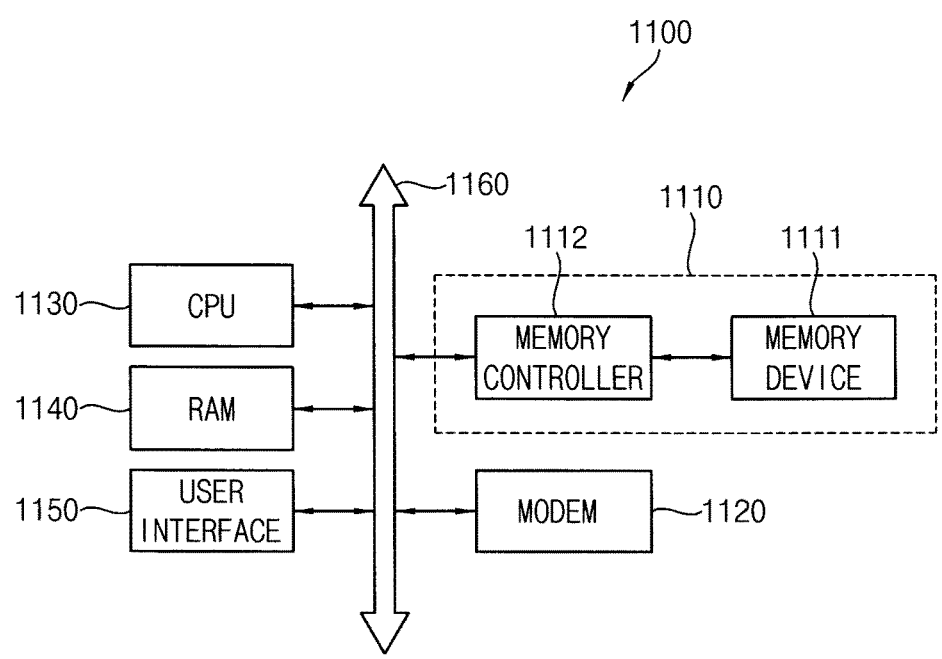

FIG. 39 is a block diagram illustrating an information processing system in accordance with an example embodiment.

Referring to FIG. 39, an information processing system 1100 may include a vertical type memory device 1111 in accordance with an example embodiment.

The information processing system 1100 may include a memory system 1110 and a modem 1120, a central processing unit 1130, a RAM 1140 and a user interface 1150, respectively making an electric connection to a system bus 1160. In the memory system 1110, data processed by the central processing unit 1130 and data inputted from the outside may be stored. Because the memory system 1110 may include the vertical type nonvolatile memory device 1111 in accordance with example embodiments, the data of a large capacity may be stably stored in the information processing system 1100.

Even though not illustrated, the information processing system 1100 in accordance with example embodiments may further include an application chipset, a camera image processor (CIS), a mobile DRAM, an input/output apparatus, etc.

The pad structure in accordance with example embodiments may be used in a vertical type nonvolatile memory device. Particularly, a vertical nonvolatile memory device may be manufactured by a simplified process in accordance with example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A pad structure of a vertical type semiconductor device, comprising:
a plurality of conductive patterns stacked in a vertical direction from a top surface of a substrate, the plurality of conductive patterns including a first group including a plurality of first conductive patterns and a plurality of second conductive patterns for confirming process disposed between the plurality of first conductive patterns included in the first group; and
a plurality of insulation patterns between the plurality of conductive patterns in the vertical direction,
wherein edge portions of the plurality of conductive patterns stacked including a first stepped shape portion having first steps in a first direction, the first direction being an extension direction of the plurality of first and second conductive patterns, and a second stepped shape portion having second steps in a second direction substantially perpendicular to the first direction, and
wherein one of the plurality of first conductive patterns has a first exposed region on a first top surface thereof that is adjacent to a first edge thereof in the first direction,
one of the plurality of second conductive patterns, which is immediately below the one of the plurality of first conductive patterns, has a second exposed region on a second top surface thereof that is adjacent to a second edge thereof in the first direction,
a first length of the first exposed region in the first direction is different from a second length of the second exposed region in the first direction, and
the one of the plurality of first conductive patterns has a first edge shape without a dent at the first edge thereof, and the one of the plurality of second conductive patterns has a second edge shape with a dent at one side of the second edge thereof such that a protrusion corresponding to the second exposed region is provided.

2. The pad structure of claim 1, wherein the second length is greater than the first length.

3. The pad structure of claim 1, wherein the first exposed region serves as an area for contacting a contact plug.

4. The pad structure of claim 1, wherein each of the plurality of second conductive patterns are between a pair of the plurality of first conductive patterns in the vertical direction.

5. The pad structure of claim 1, wherein a first height of each of the first steps is different from a second height of each of the second steps.

6. The pad structure of claim 5, wherein the first height is higher than the second height.

7. The pad structure of claim 6, wherein
each of the first steps includes two-layer conductive patterns, and
each of the second steps includes one-layer conductive pattern.

8. The pad structure of claim 1, further comprising:
a pillar structure including a channel pattern through the plurality of conductive patterns and the plurality of insulation patterns.

9. The pad structure of claim 1, wherein the plurality of conductive patterns form a plurality of first pad structures that are arranged in the second direction and spaced apart from each other.

10. The pad structure of claim 1, wherein the first length is less than the second length.

11. A pad structure of a vertical type semiconductor device, comprising:
- a plurality of conductive patterns stacked in a vertical direction from a top surface of a substrate, the plurality of conductive patterns extending in a first direction, the plurality of conductive patterns including a first group including a plurality of first conductive patterns and at least one second conductive pattern for confirming process; and
- a plurality of insulation patterns between the plurality of conductive patterns in the vertical direction,
- wherein edge portions of the plurality of conductive patterns stacked have a stepped shape in each of the first direction and a second direction perpendicular to the first direction,
- wherein each of the plurality of first conductive patterns has a first exposed region on a first top surface thereof that is adjacent to a first edge thereof in the first direction, the first exposed region serving as a first pad region,
- wherein the second conductive pattern has a second exposed region on a second top surface thereof that is adjacent to a second edge thereof in the first direction, the second exposed region serving as a second pad region, and
- wherein a first length of the first pad region of one of the plurality of first conductive patterns, which is immediately above the second conductive pattern, in the first direction is different from a second length of the second pad region in the first direction, and
- the each of the first conductive patterns has a first edge shape without a dent at the first edge thereof, and the second conductive pattern has a second edge shape with a dent at one side of the second edge thereof such that a protrusion corresponding to the second exposed region is provided.

12. The pad structure of claim 11, wherein the first length is greater than the second length.

13. The pad structure of claim 11, wherein the first length is less than the second length.

* * * * *